US012622082B2

(12) United States Patent
Chung et al.

(10) Patent No.: US 12,622,082 B2
(45) Date of Patent: May 5, 2026

(54) STACKED CMOS IMAGE SENSOR WITH STI-FREE PHOTODETECTOR ISOLATION AND METHOD FOR FORMING THE SAME

(71) Applicant: Taiwan Semiconductor Manufacturing Company, Ltd., Hsinchu (TW)

(72) Inventors: Chi-Hsien Chung, New Taipei City (TW); Tzu-Jui Wang, Fengshan City (TW); Tzu-Hsuan Hsu, Kaohsiung City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 469 days.

(21) Appl. No.: 18/150,372

(22) Filed: Jan. 5, 2023

(65) Prior Publication Data

US 2024/0072090 A1 Feb. 29, 2024

Related U.S. Application Data

(60) Provisional application No. 63/401,291, filed on Aug. 26, 2022.

(51) Int. Cl.
*H10F 39/00* (2025.01)
*H01L 23/00* (2006.01)

(52) U.S. Cl.
CPC ........... *H10F 39/809* (2025.01); *H01L 24/08* (2013.01); *H01L 24/80* (2013.01); *H10F 39/018* (2025.01);
(Continued)

(58) Field of Classification Search
CPC .... H10F 39/809; H10F 39/018; H10F 39/014; H10F 39/199; H10F 39/8037;
(Continued)

(56) References Cited

U.S. PATENT DOCUMENTS 8,629,524 B2 1/2014 Wang et al.
8,957,358 B2 2/2015 Wan et al.
(Continued)

FOREIGN PATENT DOCUMENTS

WO WO2020075391 * 4/2020

*Primary Examiner* — Duy T Nguyen
(74) *Attorney, Agent, or Firm* — Eschweiler & Potashnik, LLC

(57) ABSTRACT

Various embodiments of the present disclosure are directed towards a stacked complementary metal-oxide semiconductor (CMOS) image sensor in which a pixel sensor spans multiple integrated circuit (IC) chips and is devoid of a shallow trench isolation (STI) structure at a photodetector of the pixel sensor. The photodetector and a first transistor form a first portion of the pixel sensor at a first IC chip. A plurality of second transistors forms a second portion of the pixel sensor at a second IC chip. By omitting the STI structure at the photodetector, a doped well surrounding and demarcating the pixel sensor may have a lesser width than it would otherwise have. Hence, the doped well may consume less area of the photodetector. This, in turn, allows enhanced scaling down of the pixel sensor.

20 Claims, 28 Drawing Sheets

(52) U.S. Cl.
CPC ............... *H01L 2224/08145* (2013.01); *H01L 2224/80895* (2013.01); *H01L 2224/80896* (2013.01)

(58) Field of Classification Search
CPC ........... H10F 39/80373; H10F 39/8053; H10F 39/8063; H10F 39/807; H10F 39/811; H10F 39/813; H10F 39/804; H01L 24/08; H01L 24/80; H01L 2224/08145; H01L 2224/80895; H01L 2224/80896; H01L 23/481
USPC .......................................................... 257/444
See application file for complete search history.

(56) References Cited

U.S. PATENT DOCUMENTS

| | | | | |
|---|---|---|---|---|
| 9,136,302 | B2 | 9/2015 | Wang et al. | |
| 10,090,349 | B2 | 10/2018 | Wan et al. | |
| 10,204,950 | B1 | 2/2019 | Yamashita | |
| 2003/0096443 | A1* | 5/2003 | Hwang | H10F 39/014 |
| | | | | 438/59 |
| 2005/0110094 | A1* | 5/2005 | Kuwazawa | H10F 39/1865 |
| | | | | 257/359 |
| 2009/0085142 | A1 | 4/2009 | Tatani et al. | |
| 2010/0248412 | A1* | 9/2010 | Guidash | H10F 39/813 |
| | | | | 257/E31.127 |
| 2011/0096215 | A1* | 4/2011 | Choi | H10F 39/809 |
| | | | | 257/E31.085 |
| 2012/0080766 | A1* | 4/2012 | Chang | H10F 71/00 |
| | | | | 257/443 |
| 2013/0099291 | A1 | 4/2013 | Shimotsusa et al. | |
| 2014/0263959 | A1* | 9/2014 | Hsu | H10F 39/014 |
| | | | | 250/206 |
| 2015/0179691 | A1 | 6/2015 | Yanagita et al. | |
| 2016/0020235 | A1* | 1/2016 | Yamashita | H10F 39/811 |
| | | | | 250/206 |
| 2016/0093653 | A1 | 3/2016 | Tatani et al. | |
| 2019/0123088 | A1* | 4/2019 | Kwon | H10F 39/802 |
| 2019/0131478 | A1 | 5/2019 | Wang et al. | |
| 2021/0091127 | A1 | 3/2021 | Tsao et al. | |
| 2021/0193713 | A1* | 6/2021 | Lim | H10F 39/80373 |
| 2021/0210532 | A1 | 7/2021 | Hung et al. | |
| 2021/0384250 | A1 | 12/2021 | Oshiyama et al. | |
| 2022/0028915 | A1 | 1/2022 | Jang et al. | |
| 2022/0102397 | A1* | 3/2022 | Wu | H10F 39/014 |
| 2022/0223635 | A1 | 7/2022 | Kao et al. | |
| 2022/0392942 | A1 | 12/2022 | Tojinbara | |
| 2024/0055446 | A1 | 2/2024 | Okawa et al. | |
| 2024/0113145 | A1 | 4/2024 | Tojinbara | |
| 2024/0162264 | A1 | 5/2024 | Sze et al. | |

* cited by examiner

400D

400E

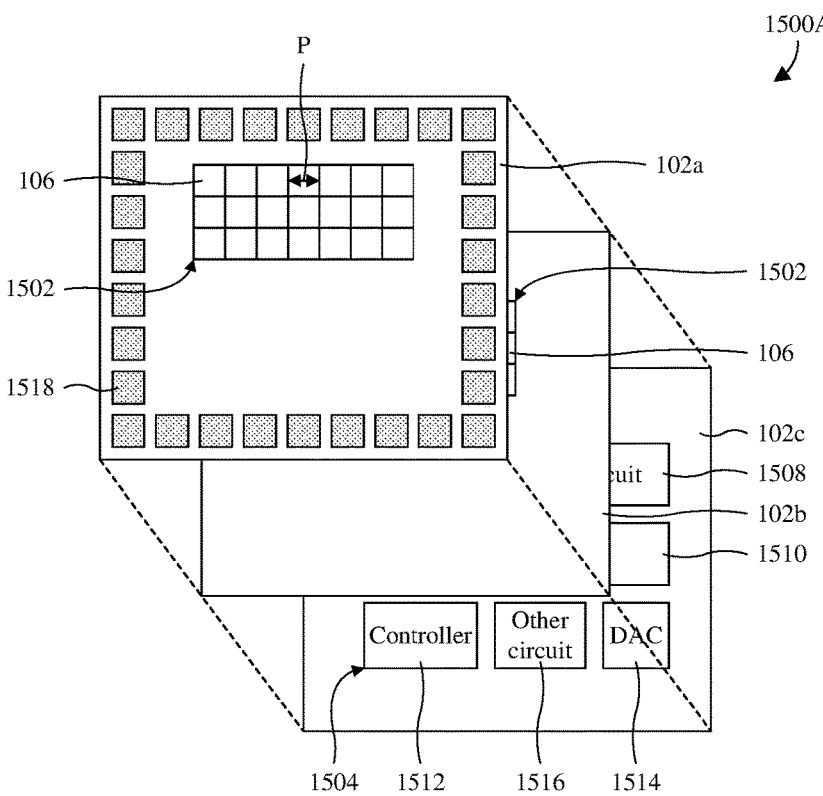
Fig. 15A
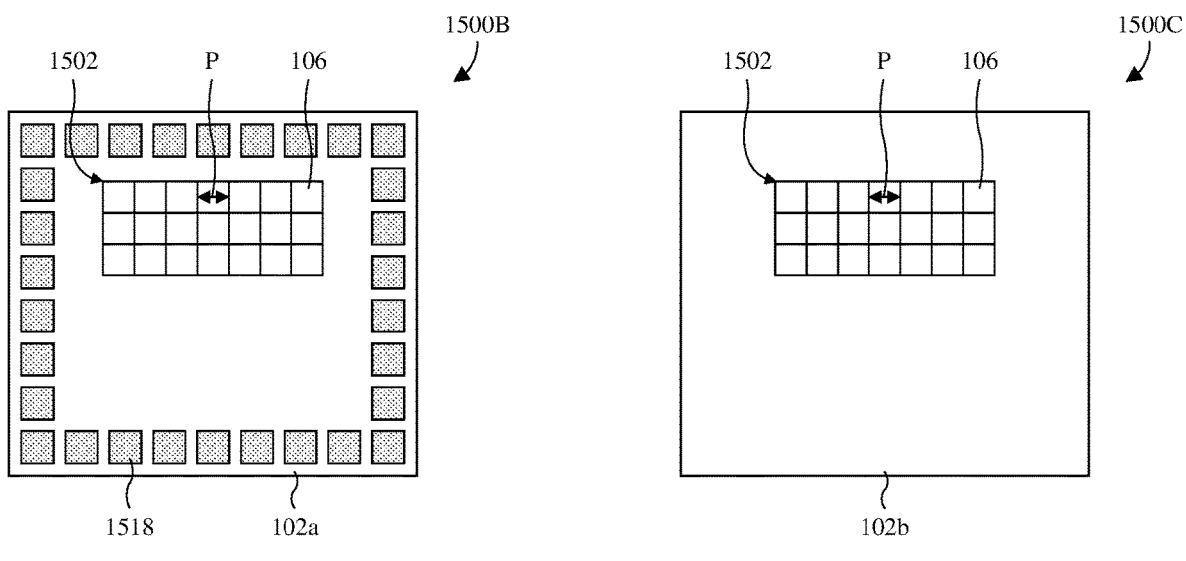
Fig. 15B               Fig. 15C

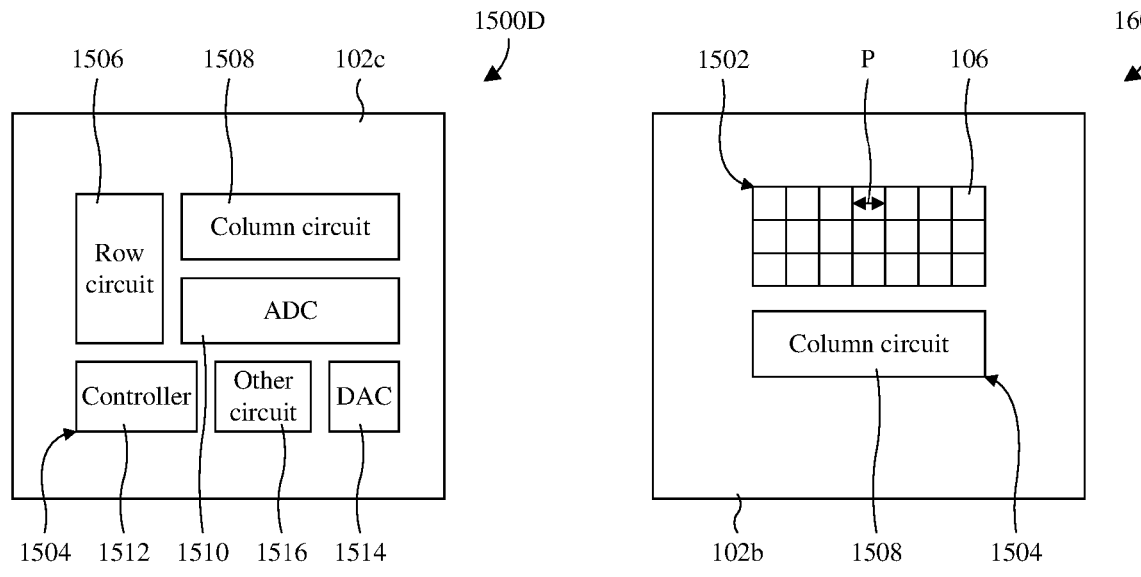
Fig. 15D
Fig. 16A
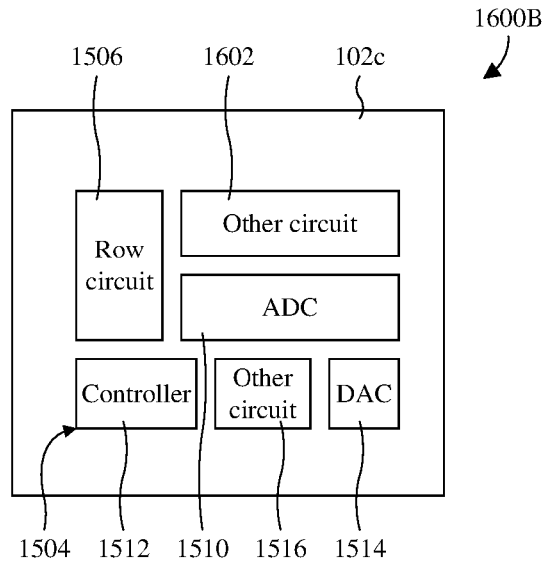
Fig. 16B

1900

2000

3800

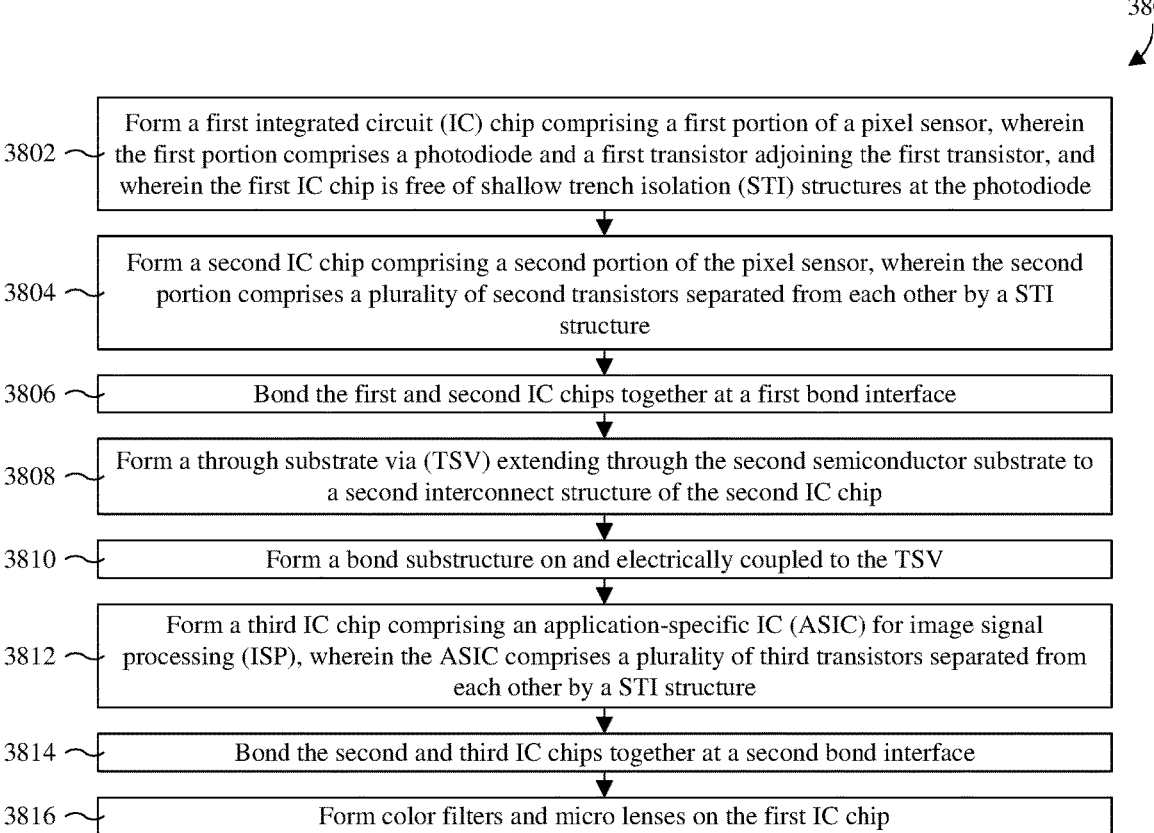

3802 — Form a first integrated circuit (IC) chip comprising a first portion of a pixel sensor, wherein the first portion comprises a photodiode and a first transistor adjoining the first transistor, and wherein the first IC chip is free of shallow trench isolation (STI) structures at the photodiode 3804 — Form a second IC chip comprising a second portion of the pixel sensor, wherein the second portion comprises a plurality of second transistors separated from each other by a STI structure 3806 — Bond the first and second IC chips together at a first bond interface 3808 — Form a through substrate via (TSV) extending through the second semiconductor substrate to a second interconnect structure of the second IC chip 3810 — Form a bond substructure on and electrically coupled to the TSV 3812 — Form a third IC chip comprising an application-specific IC (ASIC) for image signal processing (ISP), wherein the ASIC comprises a plurality of third transistors separated from each other by a STI structure 3814 — Bond the second and third IC chips together at a second bond interface 3816 — Form color filters and micro lenses on the first IC chip

Fig. 38

STACKED CMOS IMAGE SENSOR WITH STI-FREE PHOTODETECTOR ISOLATION AND METHOD FOR FORMING THE SAME

REFERENCE TO RELATED APPLICATION

This application claims the benefit of U.S. Provisional Application No. 63/401,291, filed on Aug. 26, 2022, the contents of which are incorporated by reference in their entirety.

BACKGROUND

Integrated circuits (ICs) with image sensors are used in a wide range of modern-day electronic devices, such as, for example, cameras, cell phones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A-15D illustrate block diagrams of some embodiments of a stacked image sensor in which the stacked image sensor comprises a trio of IC chips and in which an IC chip accommodating a photodetector is devoid of STI structures.

FIGS. 16A and 16B illustrate block diagrams of some alternative embodiments of the stacked image sensor of FIGS. 15A-15D.

FIG. 38 illustrates a block diagram of some embodiments of the method of FIGS. 25-37.

DETAILED DESCRIPTION

Figure 1:
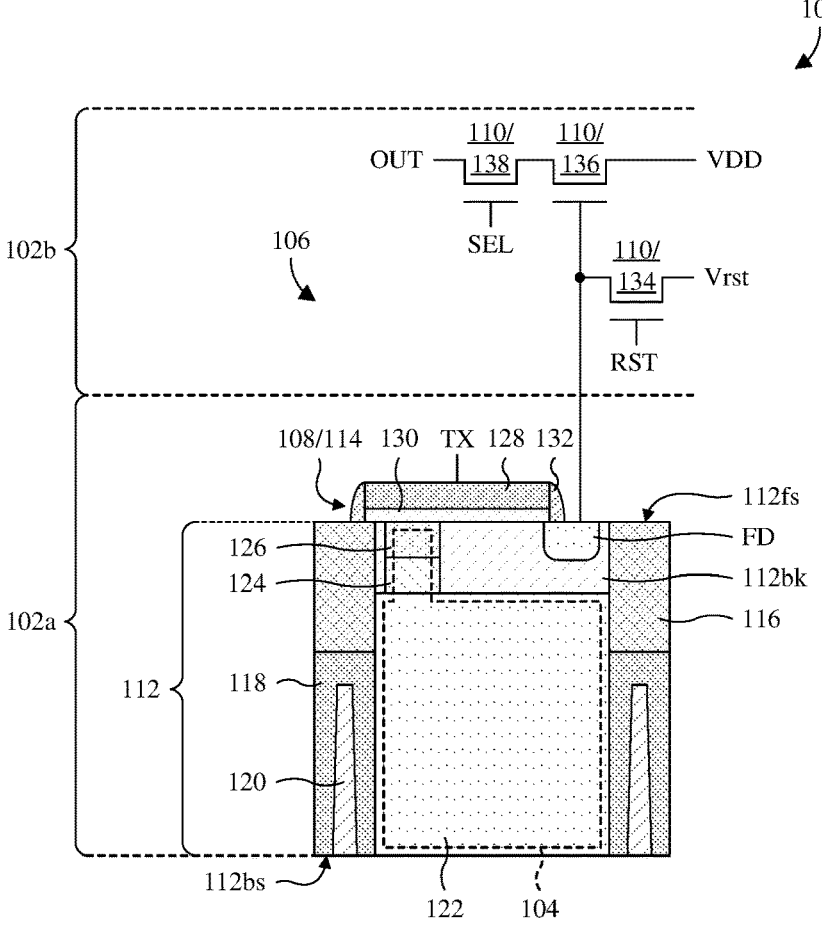
FIG. 1 illustrates a schematic view of some embodiments of a stacked image sensor in which a first integrated circuit (IC) chip accommodates a photodetector and is devoid of shallow trench isolation (STI) structures at the photodetector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise a first integrated circuit (IC) chip and a second IC chip that are stacked. The first IC chip accommodates a pixel sensor that repeats in a grid pattern, and the second IC chip accommodates an application-specific IC (ASIC) that is electrically coupled to the pixel sensor at each repetition of the pixel sensor. The pixel sensor comprises a photodetector and a plurality of transistors that are localized to the first IC chip. The photodetector is configured to accumulate charge in response to incident radiation. The transistors form a pixel circuit configured to facilitate readout of the accumulated charge.

The semiconductor manufacturing industry continuously seeks to scale down image sensors to achieve lower fabrication costs, higher device integration density, higher speeds, better performance, and so on. However, transistors of the pixel sensor limit scaling down of the pixel sensor. Therefore, a stacked CMOS image sensor may instead comprise a first IC chip, a second IC chip, and a third IC chip to facilitate further scaling down. The pixel sensor is split amongst the first and second IC chips, and the third IC chip accommodates the ASIC. The photodetector and a transfer transistor of the pixel sensor are on the first IC chip, and remaining transistors of the pixel sensor are on the second IC chip.

Both the two-chip and three-chip stacked CMOS image sensors have a shallow trench isolation (STI) structure to isolate the transistors of the pixel sensor from each other. However, substrate etching during formation of the STI structure may cause crystalline damage to a substrate in which the photodetector is arranged. This crystalline damage may cause leakage/dark current that reduces photodetector performance, whereby a doped well may be formed around the STI structure. The doped well passivates the crystalline damage to suppress the leakage/dark current. However, to sufficiently suppress the leakage/dark current, the doped well has a large width. Therefore, the doped well may significantly reduce a size of the photodetector and hence limit scaling down of the image sensor.

Various embodiments of the present disclosure are directed towards a stacked CMOS image sensor with enhanced scaling down. It has been appreciated that at least for the three-chip stacked CMOS image sensor described above, the STI structure may be omitted from the first IC chip without any significant performance tradeoff for the image sensor. By omitting the STI structure at the first IC chip, the doped isolation region may have a small width and may hence consume less area of the photodetector. This, in turn, allows enhanced scaling down of the pixel sensor at the first IC chip. Further, because the photodetector is relatively large and is at the first IC chip, but not at the second IC chip, the portion of the pixel sensor at the first IC chip may be what limits scaling down of the pixel sensor. Hence, scaling down the pixel sensor at the first IC chip may have the effect of scaling down the entire pixel sensor.

With reference to FIG. 1, a schematic view 100 of some embodiments of a stacked CMOS image sensor is provided in which a first IC chip 102a accommodates a photodetector 104 and is devoid of STI structures at the photodetector 104. As explained in more detail hereafter, omitting STI structures at the photodetector 104 allows enhanced scaling down of a pixel sensor 106 that comprises the photodetector 104.

The stacked CMOS image sensor comprises the first IC chip 102a and a second IC chip 102b. The first and second IC chips 102a, 102b are stacked, and the pixel sensor 106 is spread across the first and second IC chips 102a, 102b. The pixel sensor 106 comprises the photodetector 104 and a first transistor 108 at the first IC chip 102a, and further comprises a plurality of second transistors 110 at the second IC chip 102b. The pixel sensor 106 may, for example, be a four-transistor (4T) CMOS active pixel sensor (APS) or the like.

The photodetector 104 is in a first semiconductor substrate 112 and is configured to accumulate charge in response to incident radiation. The photodetector 104 may, for example, be a PIN diode or the like. The first transistor 108 is on and partially defined by the frontside 112$fs$ of the first semiconductor substrate 112. Further, the first transistor 108 corresponds to a transfer transistor 114 and is configured to transfer charge from the photodetector 104 to a floating diffusion node FD. The second transistors 110 are configured to facilitate readout of the photodetector 104 through coordination with transfer transistor 114.

An isolation structure surrounds the photodetector 104 to provide electrical isolation, such as, for example, inter-pixel electrical isolation. The isolation structure comprises a shallow well 116, a deep well 118, and a deep trench isolation (DTI) structure 120. The shallow and deep wells 116, 118 correspond to doped regions of the first semiconductor substrate 112 and have columnar profiles. Other suitable profiles are, however, amenable in alternative embodiments. Further, the shallow and deep wells 116, 118 share a common doping type, but have different doping profiles and/or concentrations. Sidewalls of the shallow and deep wells 116, 118 form PN junctions, which result in depletion regions that electrically isolate the pixel sensor 106 from any neighboring pixel sensors and/or structures.

The DTI structure 120 is or comprises dielectric material and extends into the deep well 118 from a backside 112$bs$ of the first semiconductor substrate 112. Further, the DTI structure 120 extends only partially through the first semiconductor substrate 112. The dielectric material may, for example, be or comprise a high k dielectric material, some other suitable dielectric material, or any combination of the foregoing. In alternative embodiments, the DTI structure 120 has a different height. In some embodiments, a height of the shallow well 116 decreases as a height of the DTI structure 120 increases.

As noted above, the image sensor is devoid of STI structures at the photodetector 104. STI structures may, for example, correspond to dielectric structures of silicon oxide or the like extending into the frontside 112$fs$ of the first semiconductor substrate 112 to provide electrical isolation between regions of the first semiconductor substrate 112. It has been appreciated that isolation structure, without any STI structure, is sufficient to provide electrical isolation for the portion of the pixel sensor 106 at the first IC chip 102a without any significant performance tradeoff. As noted above, the isolation structure comprises the isolation structure comprises the shallow well 116, the deep well 118, and the DTI structure 120.

If an STI structure were to extend into the frontside 112$fs$ of the first semiconductor substrate 112, substrate etching during formation of the STI structure would cause crystalline damage. This crystalline damage would cause leakage/dark current that reduces image sensor performance. The shallow well 116 could be formed around the STI structure to suppress the leakage/dark current at the STI structure. However, the shallow well 116 would have a larger width to sufficiently suppress the leakage/dark current. This larger width would reduce the size of the photodetector 104, thereby limiting scaling down.

By omitting the STI structure, the shallow well 116 may have a small width and may hence consume less area of the photodetector 104. This enlarges full well capacity (FWC) of the photodetector 104 and enhances charge transfer from the photodetector 104, which allow enhanced scaling down of the pixel sensor 106 at the first IC chip 102a.

Because the photodetector 104 is relatively large and is at the first IC chip 102a, but not at the second IC chip 102b, the portion of the pixel sensor 106 at the first IC chip 102a may be what limits scaling down of the pixel sensor 106. Hence, scaling down the pixel sensor 106 at the first IC chip 102a may have the effect of scaling down an entirety of the pixel sensor 106. Further, the portion of the pixel sensor 106 at the second IC chip 102b may have a surplus of space. Because of the surplus of space at the second IC chip 102b, STI structures may be used at the second IC chip 102b without limiting scaling down of the pixel sensor 106. This leads to enhanced electrical isolation at the second IC chip 102b.

With continued reference to FIG. 1, the first semiconductor substrate 112 comprises a plurality of doped regions forming the photodetector 104. The doped regions include a first doped region 122 at the backside 112bs of the first semiconductor substrate 112, and further comprise a second doped region 124 and a third doped region 126 overlying the first doped region 122 at the frontside 112fs of the first semiconductor substrate 112.

The first and second doped regions 122, 124 share a first doping type, and the third doped region 126 shares a second doping type with the shallow and deep wells 116, 118. The first and second doping types are opposite. For example, the first doping type may be n type, and the second doping type may be p type, or vice versa. The third doped region 126 is separated from the first doped region 122 by the second doped region 124, and a bulk region 112bk of the first semiconductor substrate 112 surrounds the second and third doped regions 124, 126. In some embodiments, the bulk region 112bk has the second doping type or is undoped.

The floating diffusion node FD is in the bulk region 112bk of the first semiconductor substrate 112 and corresponds to a doped region of the first semiconductor substrate 112. Further, the floating diffusion node FD has the first doping type. Hence, the floating diffusion node FD shares a doping type with the first and second doped regions 122, 124.

During operation of the photodetector 104, charge accumulates in the first and second doped regions 122, 124 in response to incident radiation. In some embodiments, the photodetector 104 is reverse biased during charge accumulation. Further, during operation of the transfer transistor 114, the transfer transistor 114 selectively transfers the accumulated charge at the photodetector 104 to the floating diffusion node FD.

The transfer transistor 114 is gated by a transfer signal TX and comprises a first gate electrode 128, a first gate dielectric layer 130, first sidewall spacers 132, and a pair of first source/drain regions. The first gate electrode 128 and the first gate dielectric layer 130 form a gate stack in which the first gate electrode 128 is separated from the first semiconductor substrate 112 by the first gate dielectric layer 130. The first sidewall spacers 132 are on sidewalls of the gate stack. One of the first source/drain regions is formed by the floating diffusion node FD, and another one of the first source/drain regions is formed collectively by the first and second doped regions 122, 124. Source/drain region(s) may refer to a source or a drain, individually or collectively dependent upon the context.

The second transistors 110 comprise a reset transistor 134, a source-follower transistor 136, and a select transistor 138. The reset transistor 134 is gated by a reset signal RST and is electrically coupled from the floating diffusion node FD to a terminal at which a reset voltage Vrst is applied. The reset transistor 134 is configured to reset the floating diffusion node FD to the reset voltage Vrst by electrically coupling the floating diffusion node FD to the reset voltage Vrst. Further, when the transfer transistor 114 is in an ON state, this electrical coupling by the reset transistor 134 may also reset the photodetector 104 to a pinning voltage or may otherwise reset the photodetector 104 to a known state.

The source-follower transistor 136 is gated by charge at the floating diffusion node FD, and the select transistor 138 is gated by a select signal SEL. Further, the source-follower transistor 136 and the select transistor 138 are electrically coupled in series from a terminal at which a power supply voltage VDD is applied to an output terminal OUT. The source-follower transistor 136 is configured to buffer and amplify a voltage at the floating diffusion node FD. The select transistor 138 is configured to selectively pass a buffered and amplified voltage from the source-follower transistor 136 to the output terminal OUT.

In some embodiments, the first and second transistors 108, 110 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing. In some embodiments, the first semiconductor substrate 112 is or comprises a bulk substrate of silicon, germanium, the like, or any combination of the foregoing, a silicon-on-insulator (SOI) substrate, or some other suitable type of semiconductor substrate.

In some embodiments, because of omission of STI structures, the image sensor may have a small pixel pitch. Such a small pixel pitch may, for example, be a pixel pitch less than about 0.7 micrometers, about 0.5 micrometers, or the like and/or may, for example, be a pixel pitch of about 0.5-0.7 micrometers or the like.

In some embodiments, because of omission of STI structures, a top surface of the first semiconductor substrate 112 has a planar or flat profile, or a substantially planar or flat profile, continuously from a first sidewall of the shallow well 116 to a second sidewall of the shallow well 116 opposite the first sidewall. A substantially planar or flat profile may, for example, have a highest elevation and a lowest elevation that are both within 10%, 5%, 1%, or some other suitable percentage of an average elevation. Further, in some embodiments, because of omission of STI structures, a top surface of the first semiconductor substrate 112 is level with a doped region of the first semiconductor substrate 112 (e.g., a top of the doped region) continuously from the first sidewall to the second sidewall. In at least some of such embodiments, the top surface is at a common elevation continuously from the first sidewall to the second sidewall. The doped region may, for example, be the floating diffusion node FD, the third doped region 126, some other suitable region, or any combination of the foregoing. The common elevation may, for example, be an elevation at which the first gate dielectric layer 130 or the first sidewall spacers 132 directly contacts the first semiconductor substrate 112.

In some embodiments, the first sidewall faces the photodetector 104, and the second sidewall faces away from the photodetector. In such embodiments, the first and second sidewalls are on a common side of the pixel sensor 106. In other embodiments, the first sidewall faces away from the photodetector 104 in a first direction, and the second sidewall faces away from away from the photodetector 104 in a second direction opposite the first direction. In such other embodiments, the first and second sidewalls are on opposite sides of the pixel sensor 106.

In some embodiments, because of omission of STI structures, the first semiconductor substrate 112 is continuous linearly in a vertical direction from the DTI structure 120 to an elevation level with a doped region (e.g., a top of the doped region). As above, the doped region may, for example, be the floating diffusion node FD, the third doped region 126, or any combination of the foregoing. Further, in some embodiments, because of the omission, the first semiconductor substrate 112 is continuous linearly in the vertical direction from the DTI structure 120 to an elevation at which the first gate dielectric layer 130 or the first sidewall spacers 132 directly contacts the first semiconductor substrate 112. The vertical direction may, for example, be orthogonal to a top or bottom surface of the first semiconductor substrate 112, orthogonal to a top or bottom surface of the first gate electrode 128, or the like.

In some embodiments, because of omission of STI structures, the shallow and deep wells 116, 118 share a common width. In some of such embodiments, the common width is at an interface at which the shallow and deep wells 116, 118 directly contact. If an STI structure was present, a width of the shallow well 116 would be larger than a width of the deep well 118 to suppress leakage/dark current at the STI structure.

In some embodiments, STI structures are omitted across an entirety of the first semiconductor substrate 112, regardless of whether at the pixel sensor 106 and/or the photodetector 104. In at least some of such embodiments, a surface of the first semiconductor substrate 112 at the frontside 112fs (e.g., a frontside surface) may have a planar or flat profile, or a substantially planar or flat profile, across the entirety of the first semiconductor substrate 112. A substantially planar or flat profile may, for example, have a highest elevation and a lowest elevation that are both within 10%, 5%, 1%, or the like of an average elevation.

Figure 2:
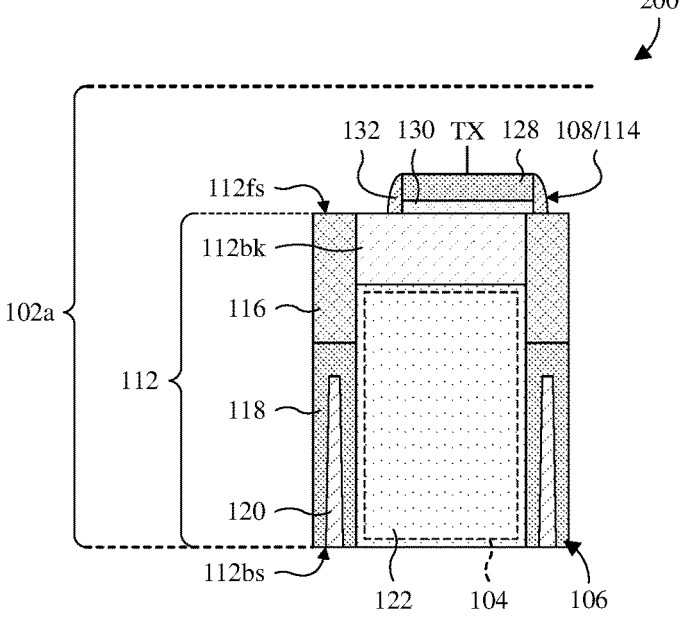
FIG. 2 illustrates another cross-sectional view of some embodiments of the first IC chip of FIG. 1.

As seen in FIG. 1, the first IC chip 102a is illustrated by cross section. FIG. 2 illustrates another cross-sectional view 200 of some embodiments of the first IC chip 102a in which the floating diffusion node FD is outside the cross-sectional view 200.

Figure 3:
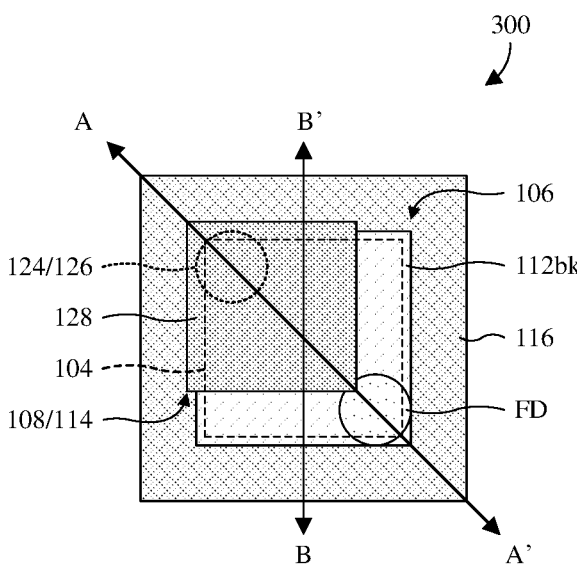
FIG. 3 illustrates a top layout view of some embodiments of the first IC chip of FIG. 1.

With reference to FIG. 3, a top layout view 300 of some embodiments of the first IC chip 102a of FIG. 1 is provided. The illustrated portion of the first IC chip 102a in FIG. 1 corresponds to a cross-sectional view, which is taken along line A-A' in FIG. 3. Further, the cross-sectional view 200 of FIG. 2 may be taken along line B-B' in FIG. 3.

The shallow well 116 extends in a closed, ring-shaped path around the photodetector 104 to separate the photodetector 104 from any other photodetectors and/or structures. Further, the first gate electrode 128 and the floating diffusion node FD are on diagonally opposite corners of the photodetector 104. In alternative embodiments, the shallow well 116 has some other suitable shape, and/or the relative positioning of the first gate electrode 128, the floating diffusion node FD, and the photodetector 104 is different.

As seen in FIG. 1, the first IC chip 102a is illustrated by cross section. FIGS. 4A-4F illustrate cross-sectional views 400A-400F of some alternative embodiments of the first IC chip 102a that may replace the embodiments of the first IC chip 102a in FIG. 1.

Figure 4A:
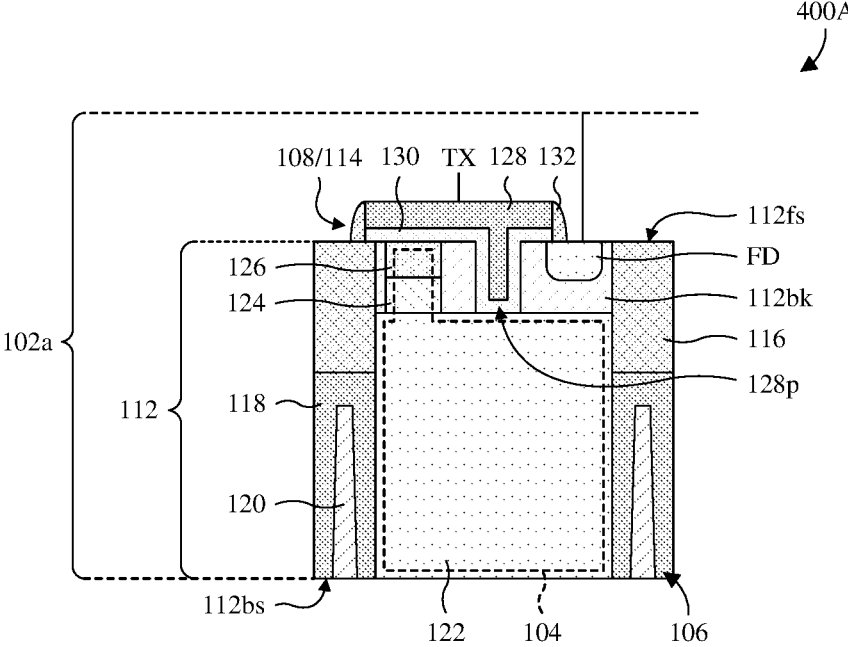
FIGS. 4A-4F illustrate cross-sectional views of some alternative embodiments of the first IC chip of FIG. 1.

In FIG. 4A, the first gate electrode 128 has a protrusion 128p protruding into the first semiconductor substrate 112.

Figure 4B:
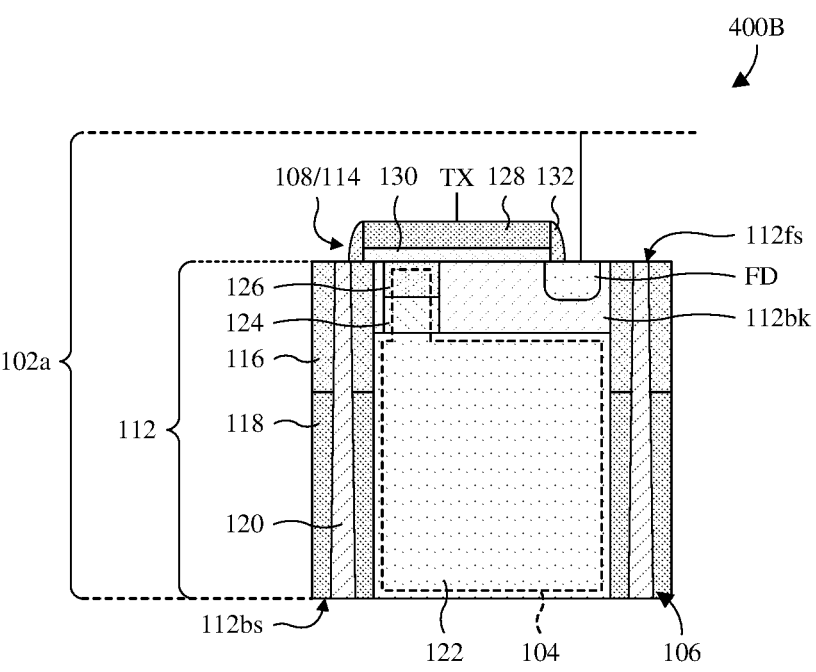
Figure 4C:
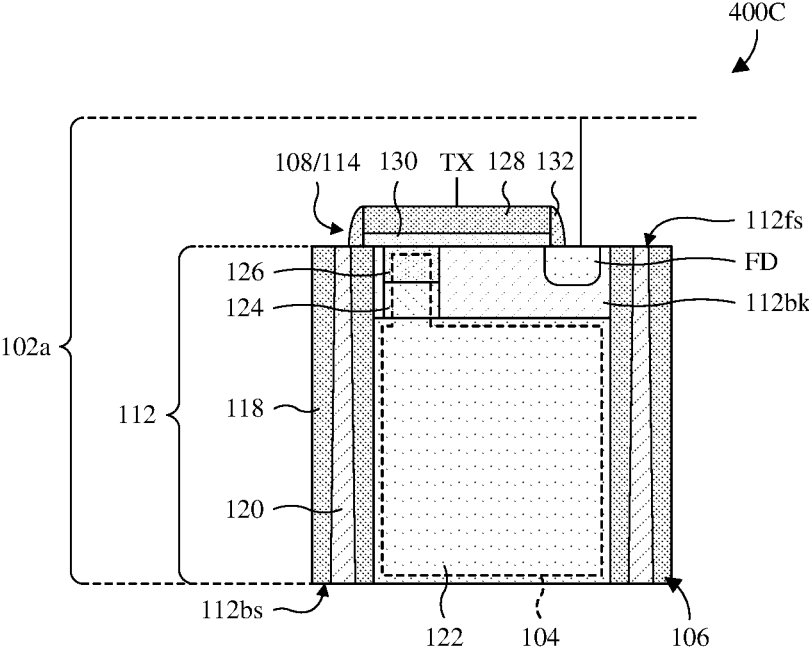

In FIG. 4B, the DTI structure 120 extends fully through the first semiconductor substrate 112. In FIG. 4C, the DTI structure 120 is as in FIG. 4B, except that the shallow well 116 is further omitted.

Figure 4D:
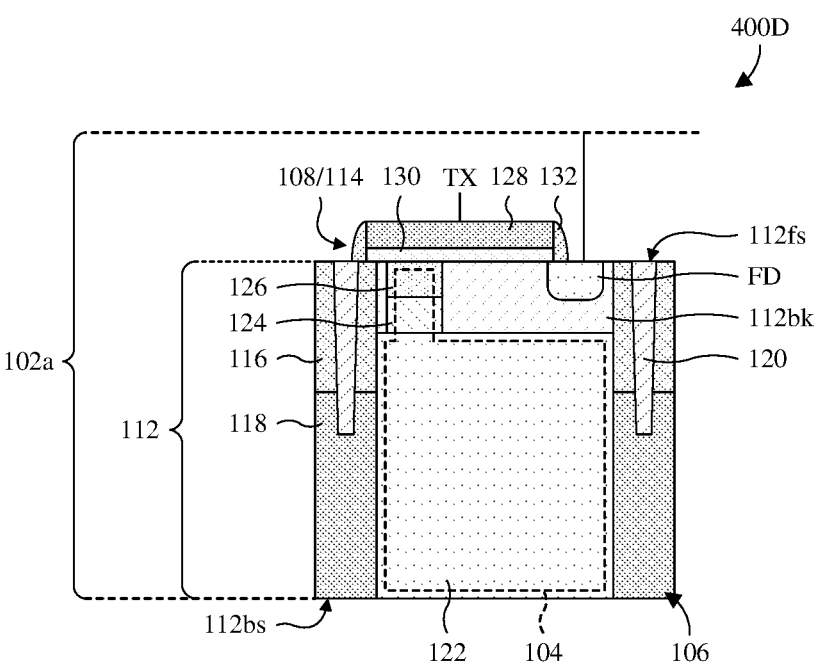
Figure 4E:
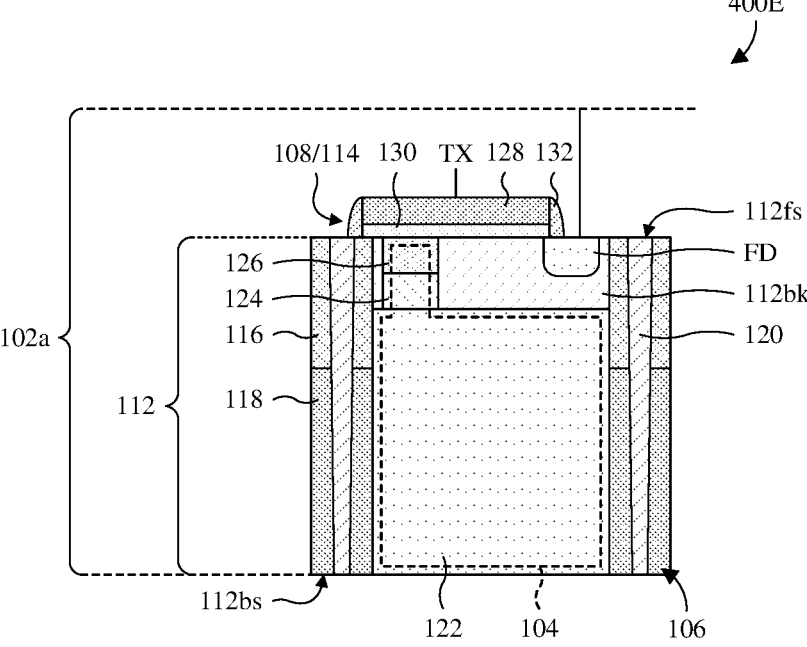
Figure 4F:
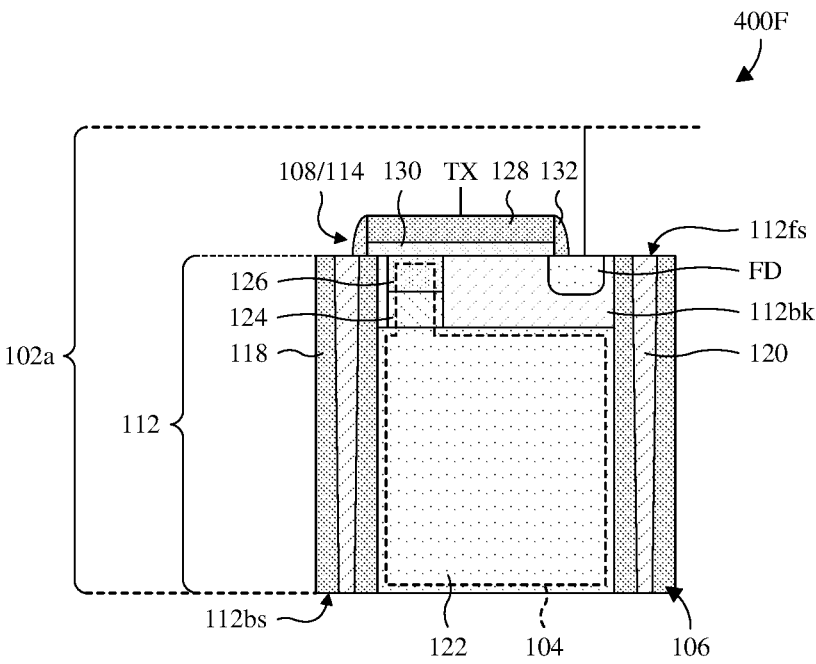

In FIG. 4D, the DTI structure 120 extends into the frontside 112fs of the first semiconductor substrate 112, instead of into the backside 112bs of the first semiconductor substrate 112 like in previous embodiments. This is illustrated by the decreasing width of the DTI structure 120 from the frontside 112fs towards the backside 112bs. In FIG. 4E, the DTI structure 120 is as in FIG. 4D, except that the DTI structure 120 extends fully through the first semiconductor substrate 112. In FIG. 4F, the DTI structure 120 is as in FIG. 4E, except that the shallow well 116 is further omitted.

Figure 5:
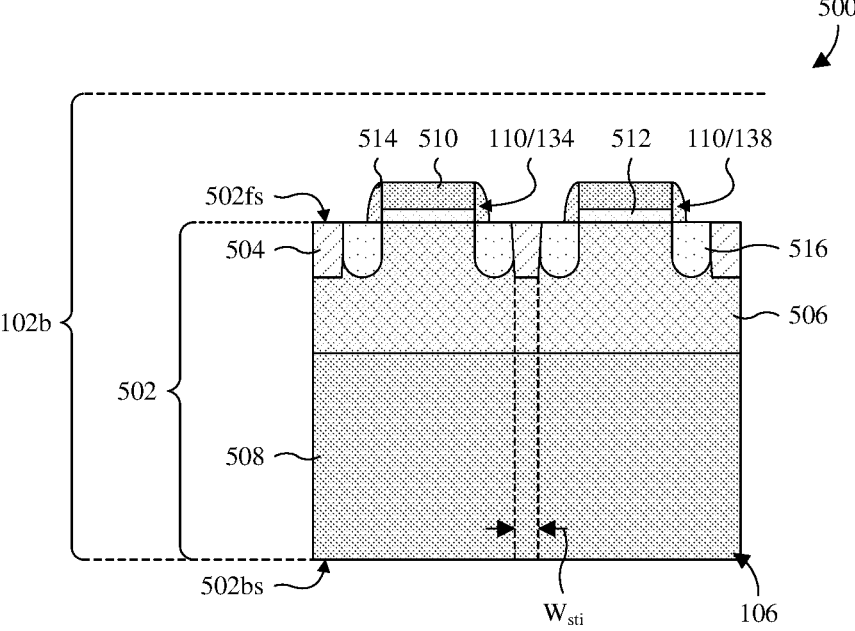
FIG. 5 illustrates a cross-sectional view of some embodiments of a second IC chip of FIG. 1.

As seen in FIG. 1, the second IC chip 102b is illustrated by a circuit diagram. FIG. 5 illustrates a cross-sectional view 500 of some embodiments of the second IC chip 102b at the reset and select transistors 134, 138. The second transistors 110, including the reset and select transistors 134, 138, are on a frontside 502fs of a second semiconductor substrate 502 and are separated from each other by an STI structure 504. The STI structure 504 extend into the frontside 502fs and is or comprises silicon oxide and/or some other suitable dielectric material(s). In contrast, the first IC chip 102a is devoid of STI structures as described above.

In some embodiments, a width $W_{sti}$ of the STI structure 504, directly between the reset and select transistors 134, 138, is about 60-80 nanometers, about 60-70 nanometers, about 70-80 nanometers, or some other suitable value. If the width $W_{sti}$ is too small (e.g., less than 60 nanometers), inter-transistor leakage may occur. If the width $W_{sti}$ is too large (e.g., more than 80 nanometers), the size of the pixel sensor 106 may be enlarged with little to no benefit.

The second semiconductor substrate 502 comprises a shallow well 506 and a deep well 508. The shallow well 506 is at the frontside 502fs of the second semiconductor substrate 502, and the deep well 508 underlies the shallow well 506 at a backside 502bs of the second semiconductor substrate 502 opposite the frontside 502fs. The shallow and deep wells 506, 508 share a doping type but have different doping concentrations and/or profiles. For example, the shallow and deep wells 506, 508 may be n type or p type. Further, the deep well 508 is spaced from the STI structures 504 by the shallow well 506. The second semiconductor substrate 502 is or comprises a bulk substrate of silicon, germanium, the like, or any combination of the foregoing, a SOI substrate, or some other suitable type of semiconductor substrate.

The second transistors 110 comprise individual second gate electrodes 510, individual second gate dielectric layers 512, individual second sidewall spacers 514, and individual pairs of second source/drain regions 516. The second gate electrodes 510 are stacked respectively with the second gate dielectric layers 512, and the second gate dielectric layers 512 separate the second gate electrodes 510 from the second semiconductor substrate 502.

The second source/drain regions 516 are in the second semiconductor substrate 502, and each of the second gate electrodes 510 is between the second source/drain regions of a respective pair. The second source/drain regions 516 correspond to doped regions of the second semiconductor substrate 502. Further, the second source/drain regions 516 have an opposite doping type as the shallow well 506. For example, the second source/drain regions 516 may be n type, whereas the shallow well 506 may be p type, or vice versa. Source/drain region(s) may refer to a source or a drain, individually or collectively dependent upon the context.

Figure 6:
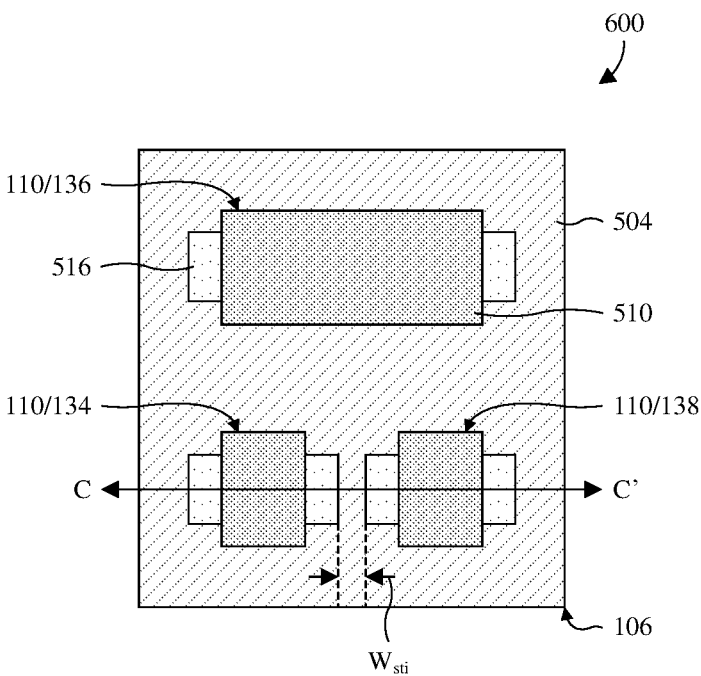
FIG. 6 illustrates a top layout view of some embodiments of the second IC chip of FIG. 5.

With reference to FIG. 6, a top layout view 600 of some embodiments of the second IC chip of FIG. 5 is provided. The cross-sectional view 500 of FIG. 5 may, for example, be taken along line C-C'. The second transistors 110, including the reset, source-follower, and select transistors 134-138, are separated from each other by the STI structure 504. The STI structure 504 extends in closed paths individually around the second transistors 110.

Figure 7:
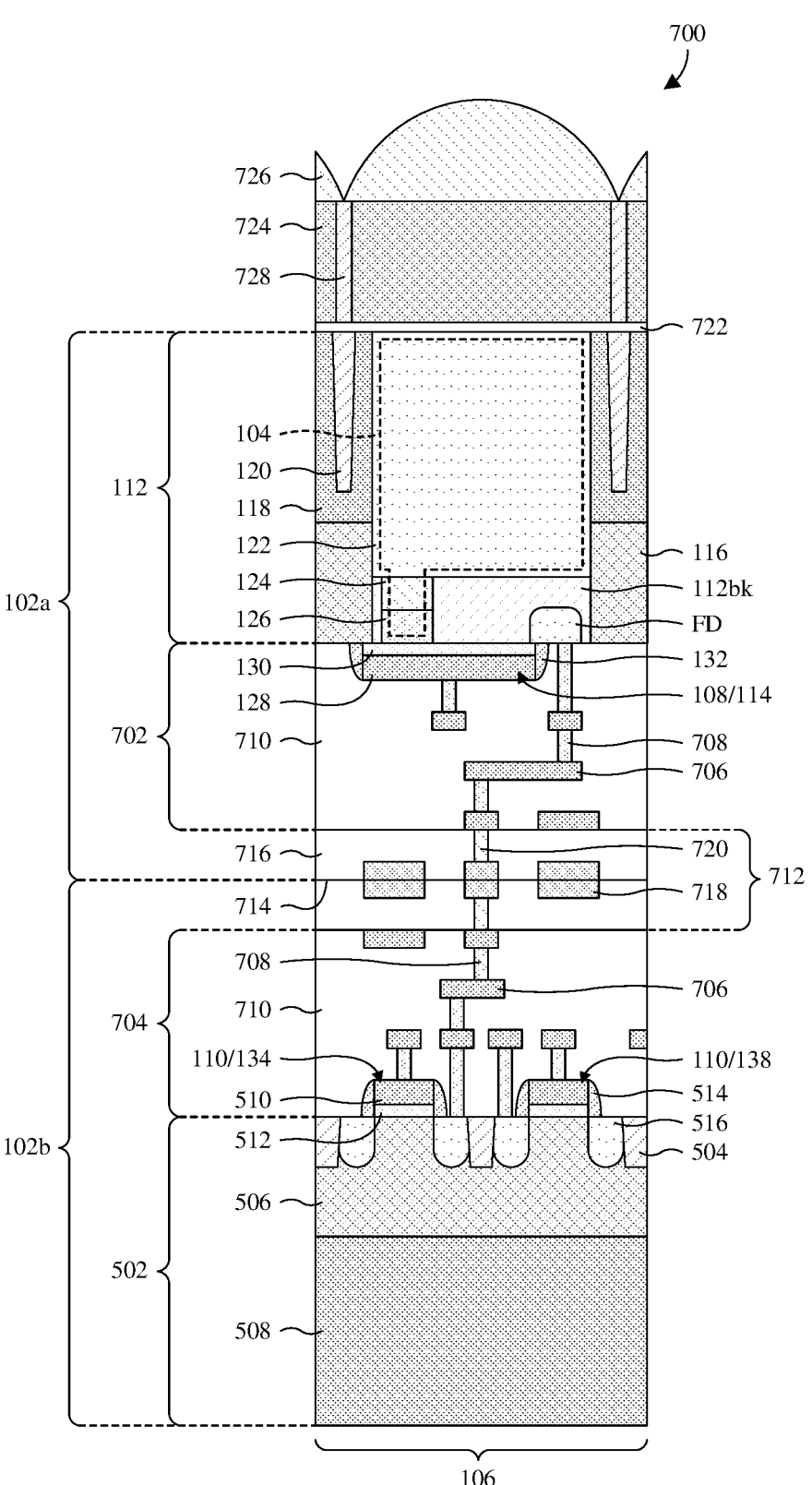
FIG. 7 illustrates a cross-sectional view of some embodiments of the stacked image sensor of FIG. 1 in which the second IC chip is illustrated by cross section.

With reference to FIG. 7, a cross-sectional view 700 of some embodiments of the image sensor of FIG. 1 is provided in which the second IC chip 102*b* is illustrated by cross section. The cross-sectional view of the second IC chip 102*b* may, for example, correspond to the cross-sectional view 500 of FIG. 5. Further, the first and second IC chips 102*a*, 102*b* are electrically coupled together by corresponding interconnect structures.

The first IC chip 102*a* comprises a first interconnect structure 702 underlying the first semiconductor substrate 112, on a frontside of the first semiconductor substrate 112. Further, the first interconnect structure 702 electrically couples to the first transistor 108. The second IC chip 102*b* underlies the first IC chip 102*a* and comprises a second interconnect structure 704. The second interconnect structure 704 overlies the second semiconductor substrate 502, on a frontside of the second semiconductor substrate 502. Further, the second semiconductor substrate 502 electrically couples to the second transistors 110.

The first and second interconnect structures 702, 704 comprise a plurality of wires 706 and a plurality of vias 708 in corresponding interconnect dielectric layers 710. The wires 706 and the vias 708 are conductive and are grouped respectively into a plurality of wire levels and a plurality of via levels that are alternatingly stacked to define conductive paths. In some embodiments, the wires 706 and the vias 708 are or comprise copper, aluminum, tantalum, titanium, the like, or any combination of the foregoing.

A first bond structure 712 is between the first and second IC chips 102*a*, 102*b* and facilitates bonding of the first and second IC chips 102*a*, 102*b* together at a first bond interface 714. Such bonding may, for example, include a combination of metal-to-metal bonding and dielectric-to-dielectric bonding at the first bond interface 714.

The first bond structure 712 comprise a plurality of bond dielectric layers 716, a plurality of bond pads 718, and a plurality of bond vias 720. The bond dielectric layers 716 are individual to the first and second IC chips 102*a*, 102*b* and directly contact at the first bond interface 714. Similarly, the bond pads 718 are individual to the first and second IC chips 102*a*, 102*b* and directly contact at the first bond interface 714. Further, the bond pads 718 are inset respectively into the bond dielectric layers 716. The bond vias 720 are respectively in the bond dielectric layers 716 and extend respectively from the bond pads 718 respectively to the first and second interconnect structures 702, 704. The bond pads 718 and the bond vias 720 are conductive. For example, the bond pads 718 and the bond vias 720 may, for example, be or comprise copper, aluminum, tantalum, titanium, the like, or any combination of the foregoing.

A backside passivation layer 722, a plurality of color filters 724, and a plurality of micro lens 726 overlie the first semiconductor substrate 112, on a backside of the first semiconductor substrate 112. The backside passivation layer 722 is dielectric and transparent to radiation. The color filters 724 overlie the backside passivation layer 722, and the micro lenses 726 respectively overlie the color filters 724. Each of the color filters 724 is configured to transmit first color wavelengths while blocking second color wavelengths. Each of the micro lenses 726 is configured to focus incident radiation on a corresponding photodetector (e.g., the photodetector 104) to enhance quantum efficiency.

A grid structure 728 separates the micro lenses 726 from each other and reflects radiation incident on sidewalls of the grid structure to enhance quantum efficiency. The grid structure 728 may, for example, be or comprise metal, a dielectric material, the like, or any combination of the foregoing.

Figure 8:
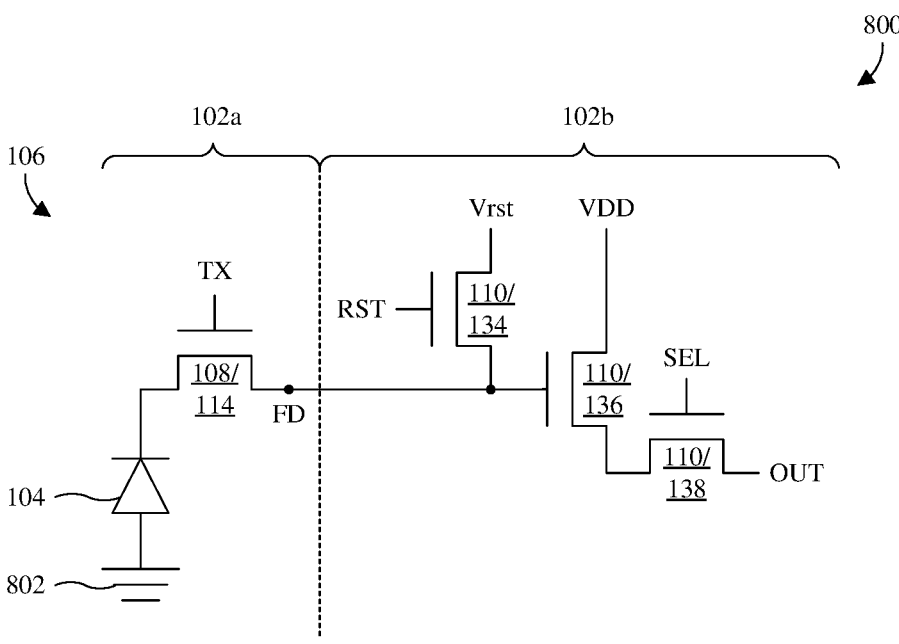
FIG. 8 illustrates a circuit diagram of some embodiments of the stacked image sensor of FIG. 1.

With reference to FIGS. 8, a circuit diagram 800 of some embodiments of the image sensor of FIG. 1 is provided. The portion of the circuit diagram 800 at the second IC chip 102*b* is as described with regard to FIG. 1. As to the portion of the circuit diagram 800 at the first IC chip 102*a*, a cathode of the photodetector 104 is electrically coupled to a source/drain region of the transfer transistor 114. Further, an anode of the photodetector 104 is electrically coupled to a terminal at which ground 802 is applied. The anode may, for example, be formed by the bulk region 112*bk*, the shallow well 116, the deep well 118, the third doped region 126, the like, or any combination of the foregoing in FIG. 7. The cathode may, for example, be formed by the first and second doped regions 122, 124 and/or the like in FIG. 7.

In some embodiments, the pixel sensor 106 has only one transistor (e.g., the first transistor 108) in the first IC chip 102*a*, and has only three or more transistors (e.g., the second transistors 110) in the second IC chip 102*b*. In other embodiments, the pixel sensor 106 has some other suitable number of transistors in the first IC chip 102*a* and/or has some other suitable number of transistors in the second IC chip 102*b*.

Figure 9:
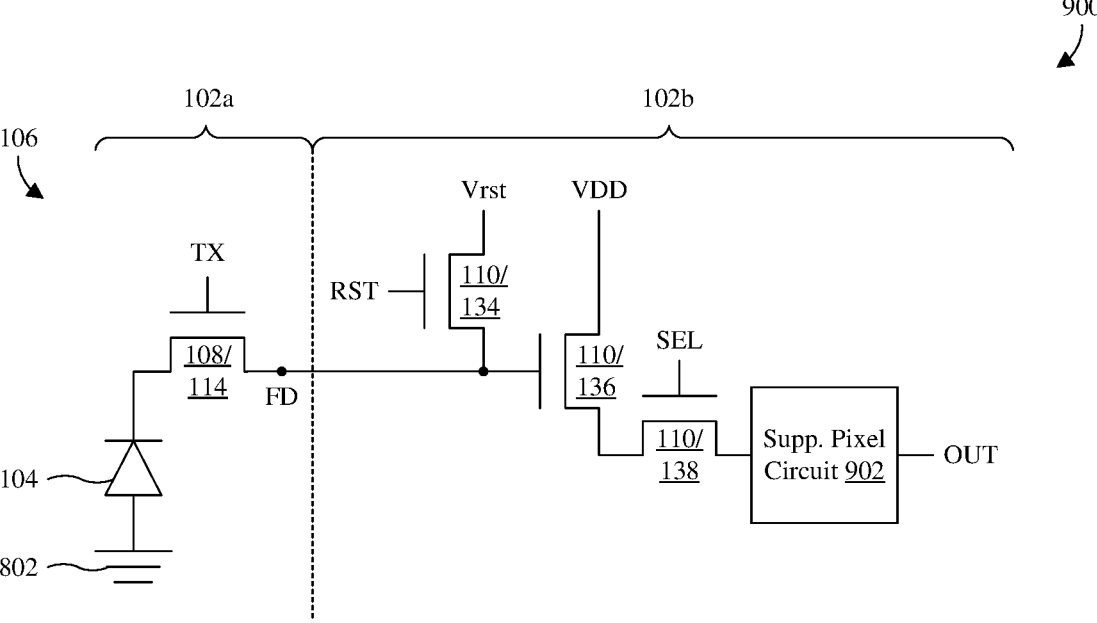
FIG. 9 illustrates a circuit diagram of some alternative embodiments of the stacked image sensor of FIG. 1.

With reference to FIG. 9, a circuit diagram 900 of some alternative embodiments of the image sensor of FIG. 1 is provided. The circuit diagram 900 is as the circuit diagram 800 of FIG. 8 is described, except that the pixel sensor 106 further comprises a supplemental pixel circuit 902 at the second IC chip 102*b*. The supplemental pixel circuit 902 is electrically coupled between the select transistor 138 and the output terminal OUT of the pixel sensor 106. Further, the supplemental pixel circuit 902 is formed by transistors and/or the like. The supplemental pixel circuit 902 is configured to perform additional processing on a signal from the select transistor 138 before passing it to the output terminal OUT. Such additional processing may, for example, include noise filtering and/or the like.

Because the photodetector 104 is relatively large and is at the first IC chip 102*a*, but not at the second IC chip 102*b*, the portion of the pixel sensor 106 at the first IC chip 102*a* may be what limits scaling down of the pixel sensor 106. Therefore, the portion of the pixel sensor 106 at the second IC chip 102*b* may have free space that enables integration of the supplemental pixel circuit 902 into the pixel sensor 106 without enlarging the pixel sensor 106.

Figure 10:
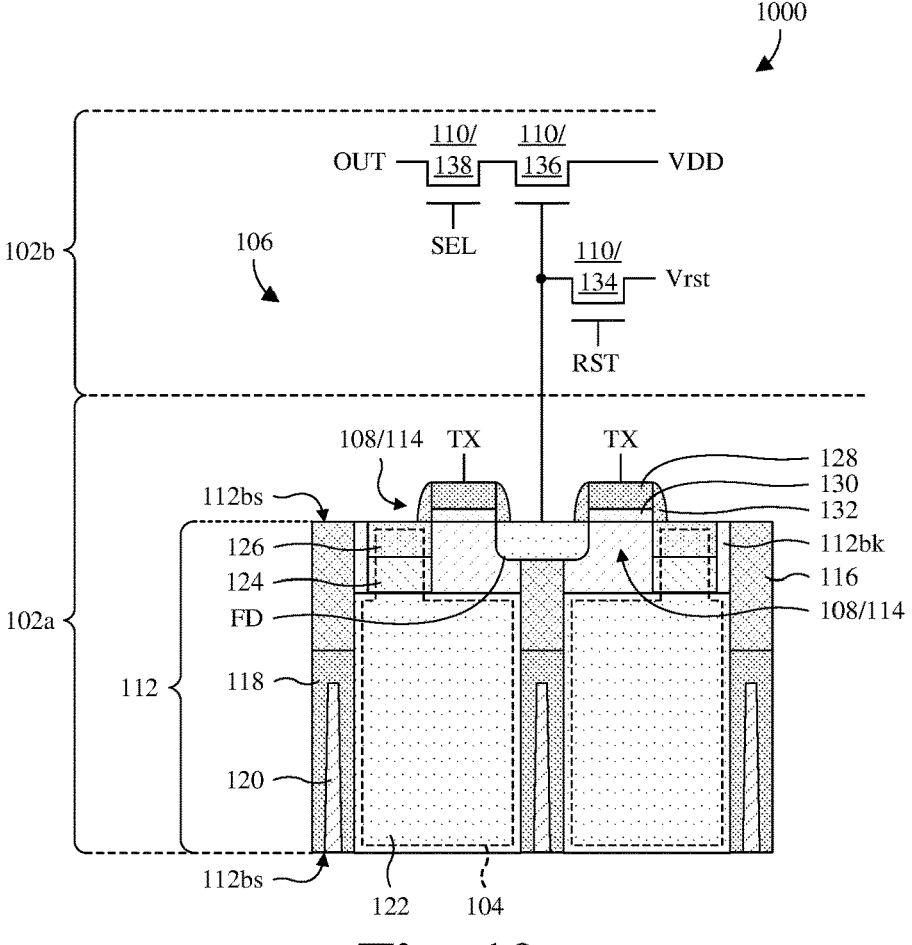
FIG. 10 illustrates a schematic view of some alternative embodiments of the stacked image sensor of FIG. 1 in which a pixel sensor comprises a plurality of photodetectors and a plurality of first transistors.

With reference to FIG. 10, a schematic view 1000 of some alternative embodiments of the image sensor of FIG. 1 is provided in which the pixel sensor 106 comprises a plurality of photodetectors 104 and a plurality of first transistors 108. The photodetectors 104 are paired with the first transistors 108 with a one-to-one correspondence, and the photodetector-transistor pairs form subpixels arranged around the floating diffusion node FD. Further, each of the first transistors 108 is a transfer transistor 114 sharing the floating diffusion node FD and configured to transfer accumulated charge from a corresponding photodetector 104 to the floating diffusion node FD. For each photodetector-transistor pair, the photodetector 104 and the transfer transistor 114 are as their counterparts are described with regard to FIG. 1.

Figure 11:
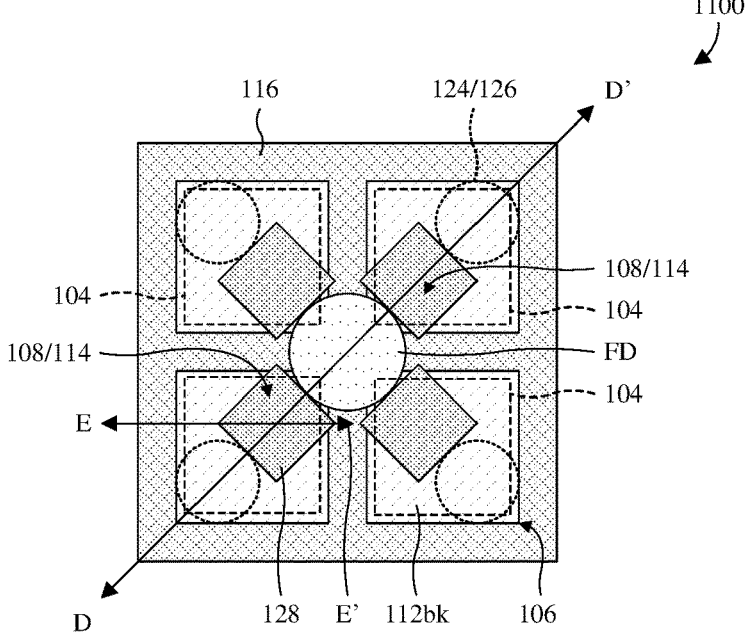
FIG. 11 illustrates a top layout view of some embodiments of the first IC chip of FIG. 10.

With reference to FIG. 11, a top layout view 1100 of some embodiments of the first IC chip 102*a* of FIG. 10 is provided. The illustrated portion of the first IC chip 102*a* in FIG. 10 corresponds to a cross-sectional view, which is taken along line D-D' in FIG. 11. The pixel sensor 106 is divided into quadrants. The quadrants are arranged around the floating diffusion node FD and each comprise a subpixel as described with regard to FIG. 10. In alternative embodiments, the pixel sensor 106 may have more or less subpixels. As noted above, a subpixel corresponds to a photodetector-transistor pair.

While FIG. 2 is described with regard to embodiments of the image sensor in FIG. 1, FIG. 2 may additionally correspond to embodiments of the image sensor in FIG. 10. As such, the cross-sectional view 200 of FIG. 2 may be taken along line E-E' in FIG. 11. Further, while FIGS. 4A-4F describe variations to embodiments of the image sensor in FIG. 1, the variations may additionally apply to embodiments of the image sensor in FIG. 10.

Figure 12:
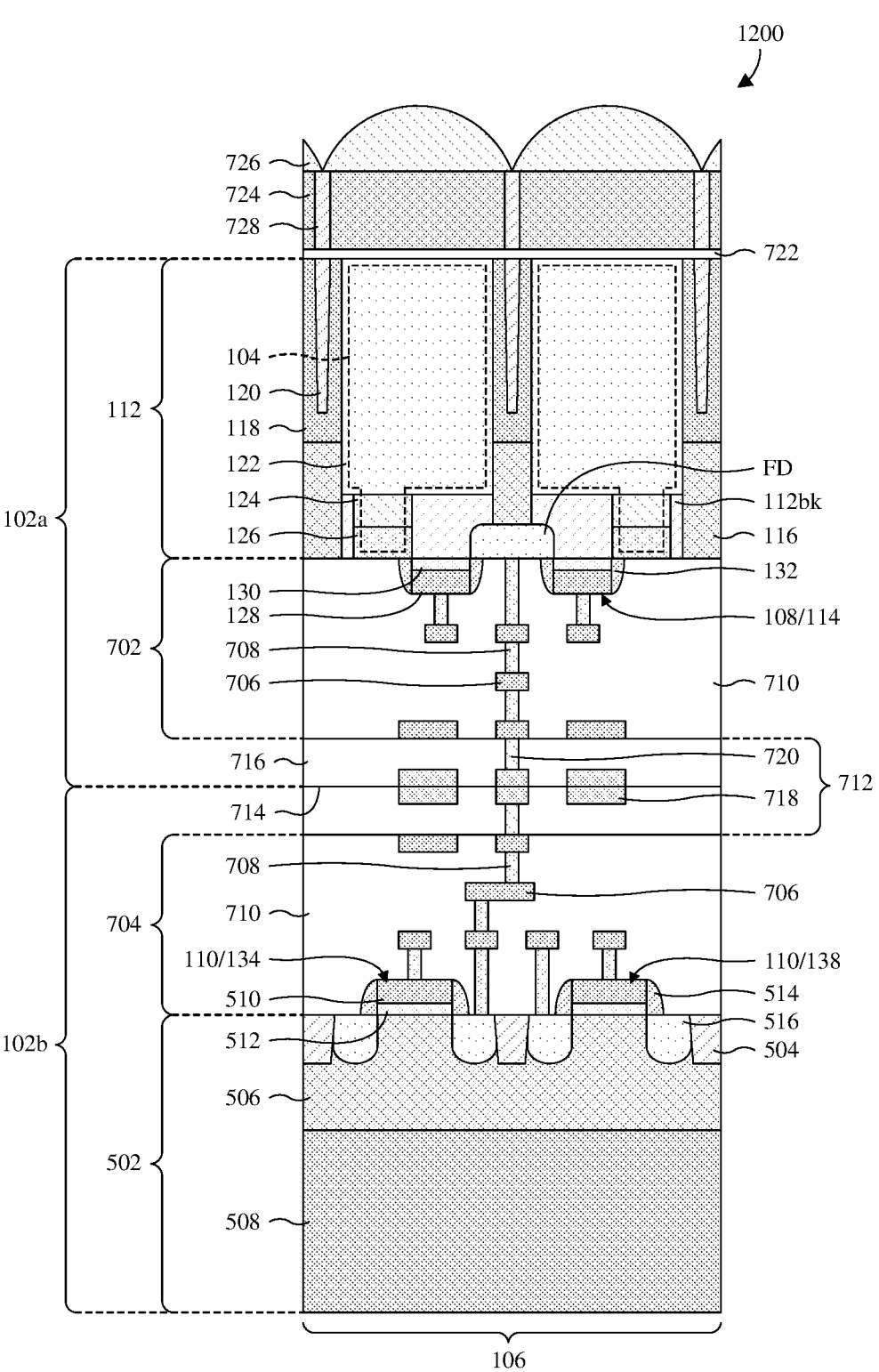
FIG. 12 illustrates a cross-sectional view of some embodiments of the stacked image sensor of FIG. 10 in which a second IC chip is illustrated by cross section.

With reference to FIG. 12, a cross-sectional view 1200 of some embodiments of the image sensor of FIG. 10 is provided in which the second IC chip 102b is illustrated by cross section. The cross-sectional view of the second IC chip 102b may, for example, correspond to the cross-sectional view 500 of FIG. 5. The first and second IC chips 102a, 102b are electrically coupled together by the first and second interconnect structures 702, 704 and the first bond structure 712. Further, the backside passivation layer 722, the color filters 724, the micro lenses 726, and the grid structure 728 overlie the first IC chip 102a.

Figure 13:
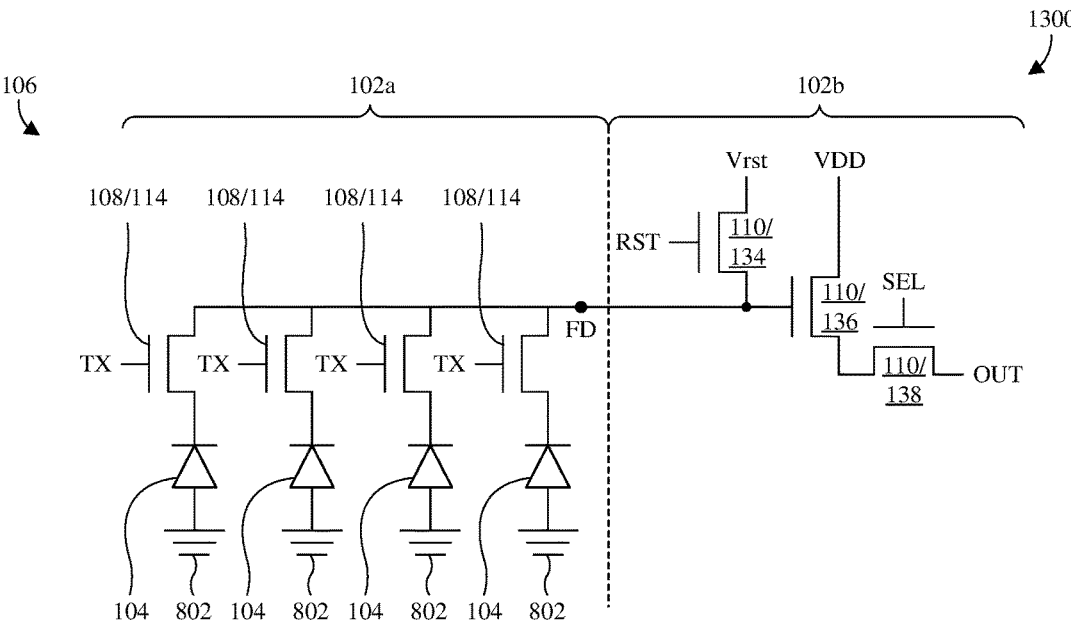
FIG. 13 illustrates a circuit diagram of some embodiments of the stacked image sensor of FIG. 10.

With reference to FIGS. 13, a circuit diagram 1300 of some embodiments of the image sensor of FIG. 10 is provided. The portion of the circuit diagram 1300 at the second IC chip 102b is as described with regard to FIGS. 1 and 10. As to the portion of the circuit diagram 1300 at the first IC chip 102a, the pixel sensor 106 comprises a plurality of photodetectors 104 and a plurality of first transistors 108. The photodetectors 104 are paired with the first transistors 108 with a one-to-one correspondence. Further, the photo-detector-transistor pairs form subpixels sharing the floating diffusion node FD, and each photodetector-transistor pair is coupled to the floating diffusion node FD as described with regard to FIG. 8.

In some embodiments, the pixel sensor 106 has a total number of transistors in the first IC chip 102a that is the same as a total number of photodetectors that the pixel sensor 106 has in the first IC chip 102a. For example, the pixel sensor 106 may have only four transistors (e.g., the first transistors 108) in the first IC chip 102a and only four photodetectors (e.g., the photodetectors 104) in the first IC chip 102a. In some embodiments, the pixel sensor 106 has only three or more transistors (e.g., the second transistors 110) in the second IC chip 102b.

Figure 14:
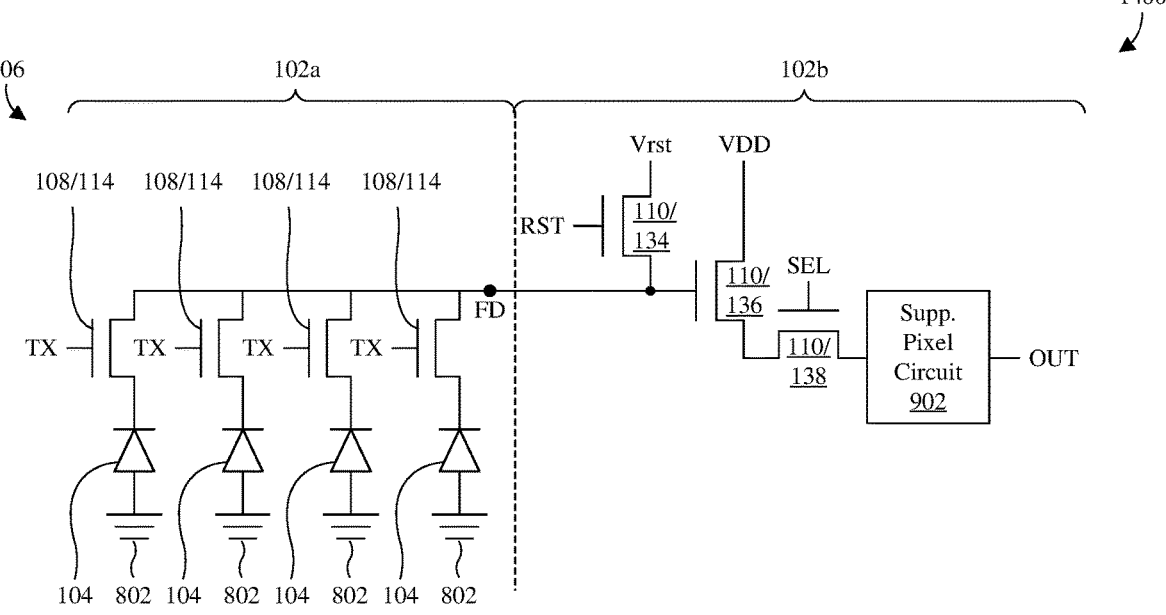
FIG. 14 illustrates a circuit diagram of some alternative embodiments of the stacked image sensor of FIG. 10.

With reference to FIG. 14, a circuit diagram 1400 of some alternative embodiments of the image sensor of FIG. 10 is provided. The circuit diagram 1400 is as the circuit diagram 1300 of FIG. 13 is described, except that the pixel sensor 106 further comprises a supplemental pixel circuit 902 at the second IC chip 102b. The supplemental pixel circuit 902 is electrically coupled between the select transistor 138 and the output terminal OUT of the pixel sensor 106. Further, the supplemental pixel circuit 902 is as described with regard to FIG. 9.

With reference to FIGS. 15A-15D, block diagrams 1500A-1500D of some embodiments of an image sensor is provided in which the image sensor comprises a first IC chip 102a, a second IC chip 102b, and a third IC chip 102c. FIG. 15A illustrates an exploded block diagram 1500A of the image sensor, whereas FIGS. 15B-15D illustrate block diagrams 1500B-1500D respectively of the first, second, and third IC chips 102a-102c.

The first IC chip 102a overlies the second IC chip 102b, and a pixel array 1502 spans across the first and second IC chips 102a, 102b. The pixel array 1502 comprises a plurality of pixel sensors 106 arranged in a plurality of rows and a plurality of columns. For example, the pixel array 1502 may have three rows and seven columns. In some embodiments, a pitch P of the pixel sensors 106 is less than 0.7 micrometers, 0.5 micrometers, or the like and/or is about 0.5-0.7 micrometers, about 0.3-0.5 micrometers, or the like. Each of the pixel sensors 106 is as illustrated and described with regard to any one or combination of FIGS. 1-3, 4A-4F, and 5-14. Hence, the first IC chip 102a is devoid of STI structures at the pixel sensors 106 to enable enhanced scaling down of the pixel sensors 106, and the second IC chip 102b has STI structures for enhanced electrical isolation between transistors.

The third IC chip 102c underlies the second IC chip 102b and accommodates an application-specific integrated circuit (ASIC) 1504 for image signal processing (ISP). The ASIC 1504 may, for example, comprise a row circuit 1506, a column circuit 1508, an analog-to-digital converter (ADC) 1510, a controller circuit 1512, a digital-to-analog circuit (DAC) 1514, some other suitable circuit 1516, the like, or any combination of the foregoing. Further, the ASIC 1504 may, for example, be formed by logic devices, including input/output (I/O) devices, core devices, the like, or any combination of the foregoing.

A plurality of pads 1518 are spaced from each other and along a periphery of the first IC chip 102a in a ring-shaped pattern to surround the pixel array 1502. The pads 1518 are conductive and provide electrical coupling to the pixel array 1502 and the ASIC 1504 from outside the image sensor. Electrical coupling from the pads 1518 to the pixel array 1502 and the ASIC 1504 may, for example, be achieved by through substrate vias (TSVs), interconnect structures, bond structures, and the like, examples of which are discussed hereafter.

With reference to FIGS. 16A and 16A, block diagrams 1600A, 1600B of some alternative embodiments of the image sensor of FIGS. 15A-15D is provided in which the ASIC 1504 is spread across the second and third IC chips 102b, 102c. FIGS. 16A and 16B correspond to alternatives of the second and third IC chips 102b, 102c in FIGS. 15A-15D. The first IC chip 102a remains unchanged in these alternative embodiments.

The column circuit 1508 is at the second IC chip 102b instead of at the third IC chip 102c. In alternative embodiments, one or more of the row circuit 1506, the controller circuit 1512, the like, or any combination of the foregoing may be additionally or alternatively at the second IC chip 102b instead of at the third IC chip 102c. Spreading the ASIC 1504 across the second and third IC chips 102b, 102c allows unused space on the second IC chip 102b to be used and allows the image sensor to have more circuits. For example, the image sensor may comprise another circuit 1602 at the third IC chip 102c.

Figure 17:
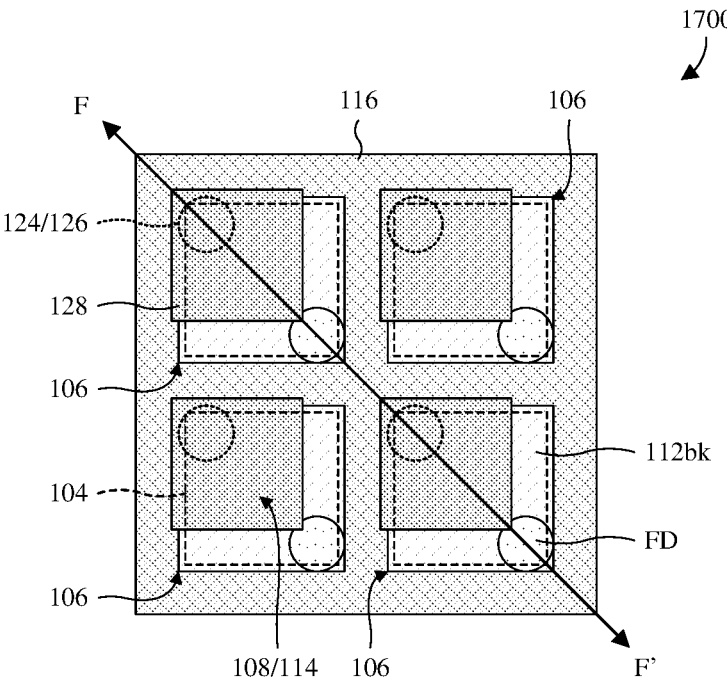
FIG. 17 illustrates a top layout view of some embodiments of a first IC chip of the stacked image sensor of FIGS. 15A-15D.

With reference to FIG. 17, a top layout view 1700 of some embodiments of the first IC chip 102a of FIGS. 15A-15D is provided. The top layout view 1700 corresponds to a 2×2 subarray of the pixel array 1502 of FIGS. 15A-15D, where each pixel sensor has a top layout as illustrated and described with regard to FIG. 3. The shallow well 116 has a grid-shaped pattern that individually surrounds each of the photodetectors 104.

Figure 18:
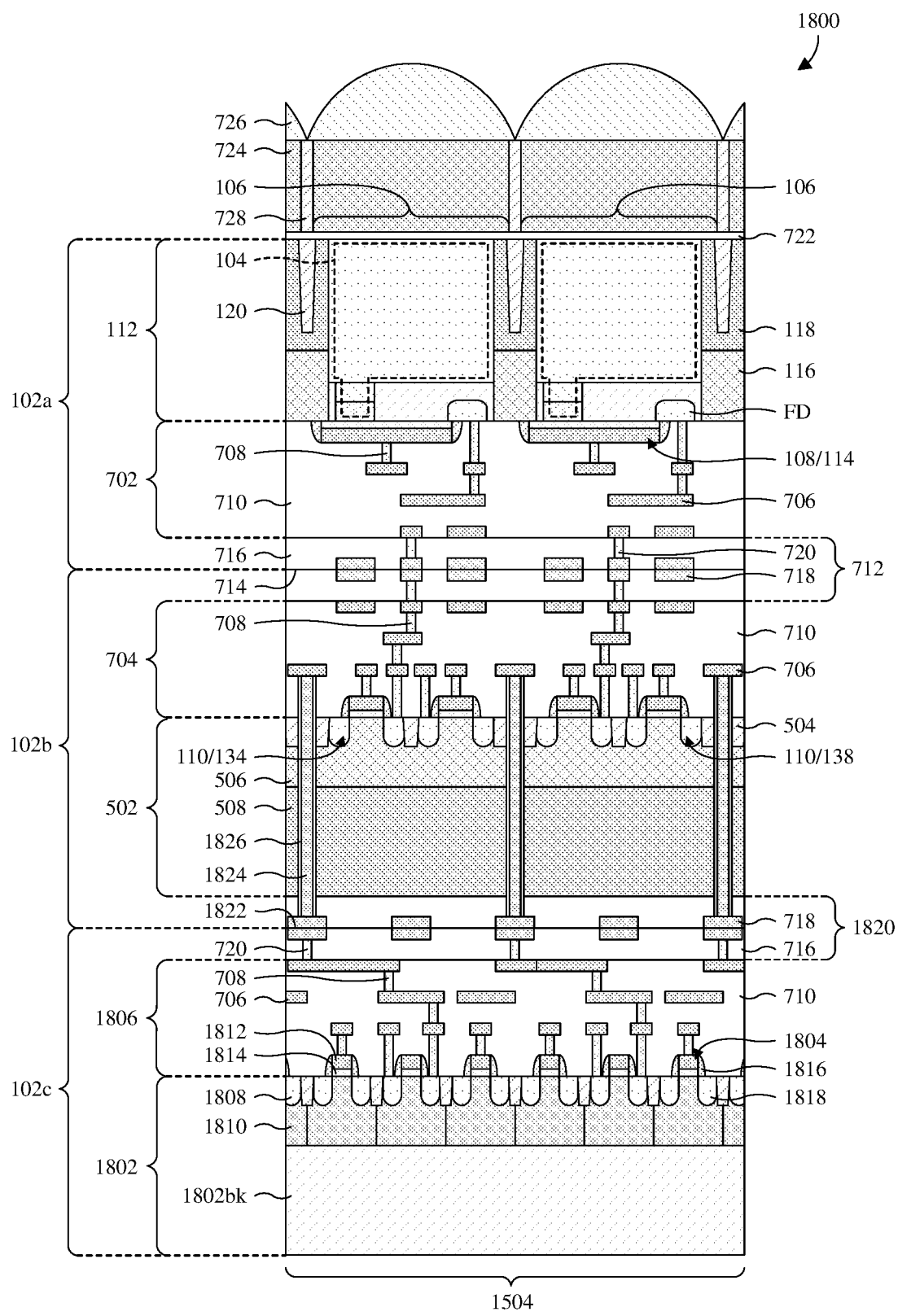
FIG. 18 illustrates a cross-sectional view of some embodiments of the stacked image sensor of FIGS. 15A-15D.

With reference to FIG. 18, a cross-sectional view 1800 of some embodiments of the image sensor of FIGS. 15A-15D is provided. The cross-sectional view 1800 may, for example, be taken along line F-F' in FIG. 17. The image sensor comprises a plurality of pixel sensors 106, each as described with regard to FIG. 7, and further comprises the third IC chip 102*c*.

The third IC chip 102*c* underlies and electrically couples to the second IC chip 102*b*. Further, the third IC chip 102*c* comprises a third semiconductor substrate 1802, a plurality of third transistors 1804, and a third interconnect structure 1806. The third transistors 1804 and the third interconnect structure 1806 overlie the third semiconductor substrate 1802 on a frontside of the third semiconductor substrate 1802. Further, the third transistors 1804 are between the third semiconductor substrate 1802 and the third interconnect structure 1806.

The third transistors 1804 are separated by an STI structure 1808 extending into the frontside of the third semiconductor substrate 1802. The STI structure 1808 may, for example, be or comprise silicon oxide and/or the like. Further, the third transistors 1804 are respectively on doped wells 1810 in the third semiconductor substrate 1802. In some embodiments, the doped wells 1810 are individual to the third transistors 1804. Each of the doped wells 1810 is p type or n type and, in some embodiments, each of the doped wells 1810 has an opposite doping type as neighboring doped wells. In some embodiments, a bulk region 1802*bk* of the third semiconductor substrate 1802 is doped (e.g., p or n type). In other embodiments, the bulk region 1802*bk* of the third semiconductor substrate 1802 is intrinsic.

The third transistors 1804 form the ASIC 1504 and may, for example, be MOSFETs, FinFETs, GAA FETs, the like, or any combination of the foregoing. In some embodiments, some of the third transistors 1804 are n-type field-effect transistors and some of the third transistors 1804 are p-type field-effect transistors. The third transistors 1804 comprise individual third gate electrodes 1812, individual third gate dielectric layers 1814, individual third sidewall spacers 1816, and individual pairs of third source/drain regions 1818.

The third gate electrodes 1812 are stacked respectively with the third gate dielectric layers 1814, which separate the third gate electrodes 1812 from the third semiconductor substrate 1802. The third source/drain regions 1818 are in the third semiconductor substrate 1802, and each of the third gate electrodes 1812 is between the third source/drain regions of a respective pair of third source/drain regions 1818. Source/drain region(s) may refer to a source or a drain, individually or collectively dependent upon the context.

The third interconnect structure 1806 overlies and electrically couples to the third transistors 1804. The third interconnect structure 1806 is as the first and second interconnect structures 702, 704 are described and hence comprise a plurality of wires 706 and a plurality of vias 708 stacked in a corresponding interconnect dielectric layer 710.

A second bond structure 1820 is between the second and third IC chips 102*b*, 102*c* and facilitates bonding of the second and third IC chips 102*b*, 102*c* together at a second bond interface 1822. Such bonding may, for example, include a combination of metal-to-metal bonding and dielectric-to-dielectric bonding at a bond interface.

The second bond structure 1820 is largely as the first bond structure 712 is described, whereby the second bond structure 1820 comprises a plurality of bond dielectric layers 716, a plurality of bond pads 718, and a plurality of bond vias 720. The bond dielectric layers 716 are individual to the second and third IC chips 102*b*, 102*c* and directly contact at the second bond interface 1822. The bond pads 718 are individual to the second and third IC chips 102*b*, 102*c* and directly contact at the second bond interface 1822. Further, the bond pads 718 are inset respectively into the bond dielectric layers 716. The bond vias 720 are in the bond dielectric layer 716 of the third IC chip 102*c* and extend respectively from the bond pads 718 of the third IC chip 102*c* to the third interconnect structures 1806.

A plurality of TSVs 1824 extend through the second semiconductor substrate 502, from the second interconnect structure 704 to the second bond structure 1820. The TSVs 1824 are conductive and hence facilitate electrical coupling between the second interconnect structure 704 and the second bond structure 1820. Further, the TSVs 1824 are separated from the second semiconductor substrate 502 by TSV dielectric layers 1826.

Figure 19:
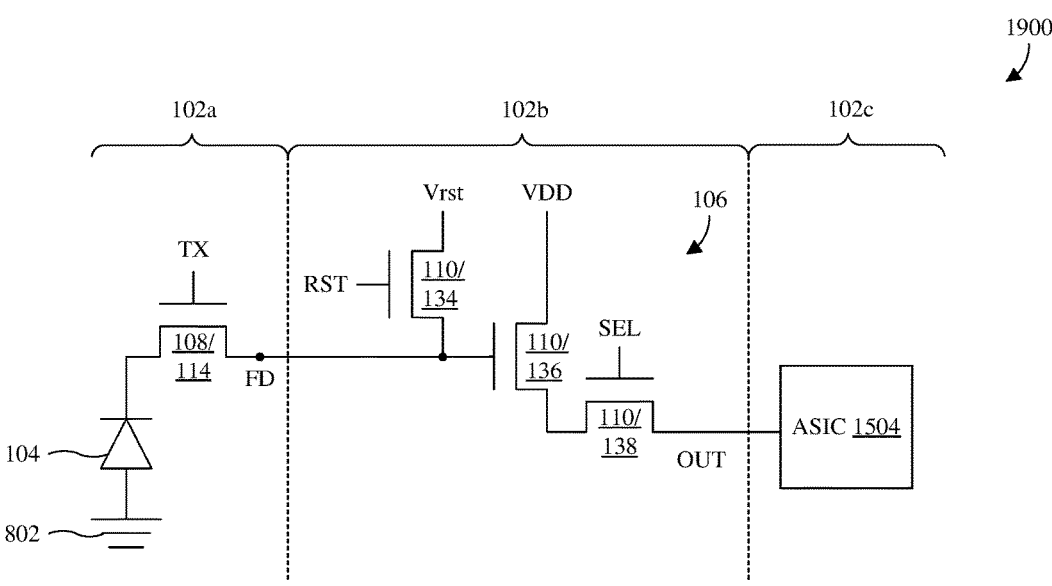
FIG. 19 illustrates a circuit diagram of some embodiments of a pixel sensor of FIG. 18.

With reference to FIG. 19, a circuit diagram 1900 of some embodiments of the image sensor of FIG. 18 is provided. The circuit diagram 1900 is similar to the circuit diagram 800 of FIG. 8, except for inclusion of the ASIC 1504. Further, as should be appreciated, the circuit diagram 1900 illustrates a single pixel sensor 106.

Figure 20:
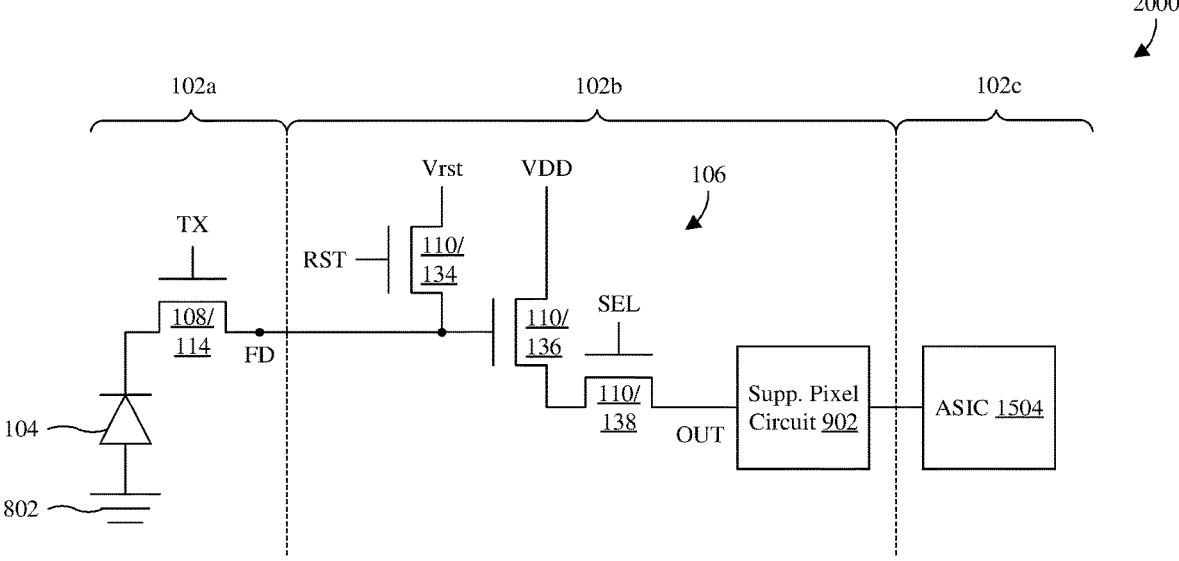
FIG. 20 illustrates a circuit diagram of some alternative embodiments of a pixel sensor of FIG. 18.

With reference to FIG. 20, a circuit diagram 2000 of some alternative embodiments of the image sensor of FIG. 18 is provided. The circuit diagram 2000 is similar to the circuit diagram 1900 of FIG. 19, except for inclusion of a supplemental pixel circuit 902 at the second IC chip 102*b*. The supplemental pixel circuit 902 is electrically coupled between the select transistor 138 and the output terminal OUT of the pixel sensor 106. The supplemental pixel circuit 902 is configured to perform additional processing on a signal from the select transistor 138 before passing it to the output terminal OUT.

Figure 21:
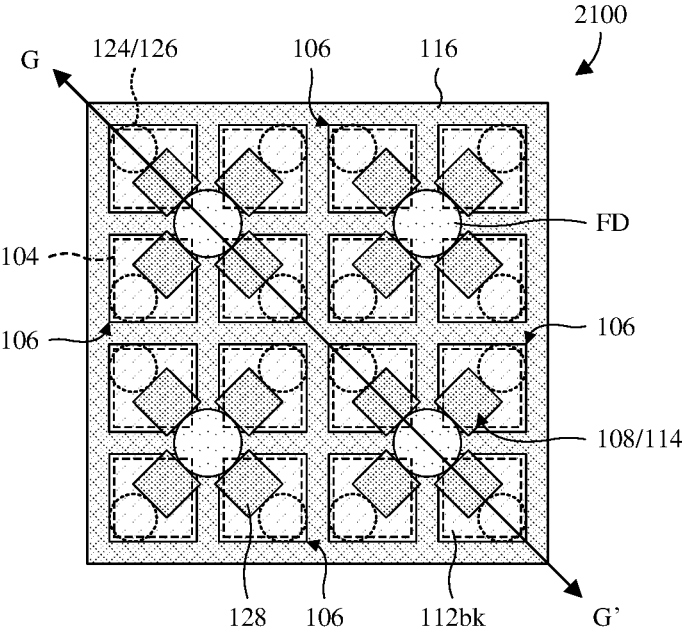
FIG. 21 illustrates a top layout view of some alternative embodiments of a first IC chip of the stacked image sensor of FIGS. 15A-15D.

With reference to FIG. 21, a top layout view 2100 of some alternative embodiments of the first IC chip 102*a* of FIGS. 15A-15D is provided. The top layout view 2100 corresponds to a 2×2 subarray of the pixel array 1502 of FIGS. 15A-15D, where each pixel sensor has a top layout as illustrated and described with regard to FIG. 11. The shallow well 116 has a grid-shaped pattern that individually surrounds each of the photodetectors 104.

Figure 22:
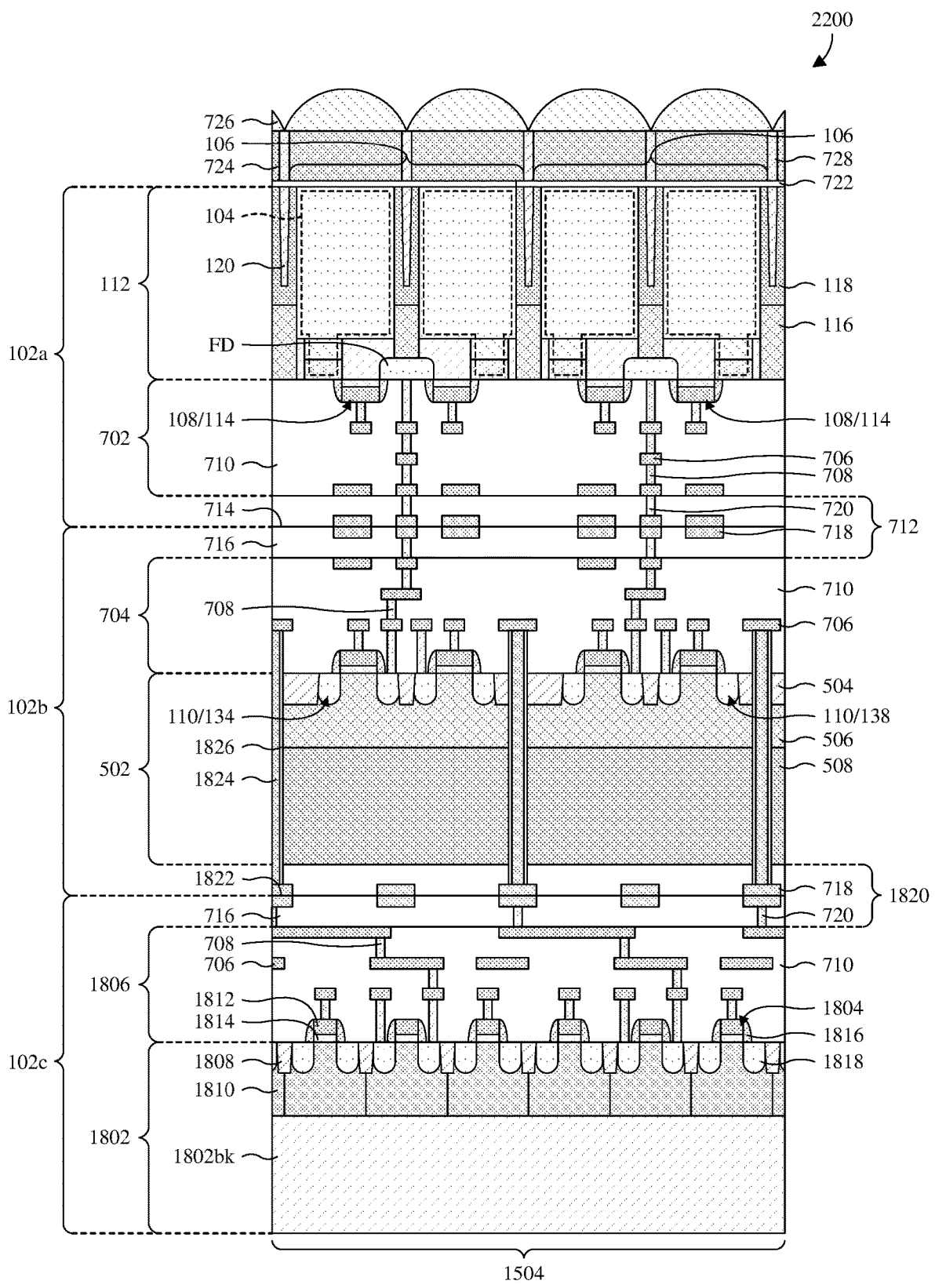
FIG. 22 illustrates a cross-sectional view of some alternative embodiments of the image sensor of FIGS. 15A-15D.

With reference to FIG. 22, a cross-sectional view 2200 of some alternative embodiments of the image sensor of FIGS. 15A-15D is provided. The cross-sectional view 2200 may, for example, be taken along line G-G' in FIG. 21. The image sensor comprises a plurality of pixel sensors 106, each as described with regard to FIG. 12, and further comprises the third IC chip 102*c*. The third IC chip 102*c* may, for example, be as described at FIG. 18.

Figure 23:
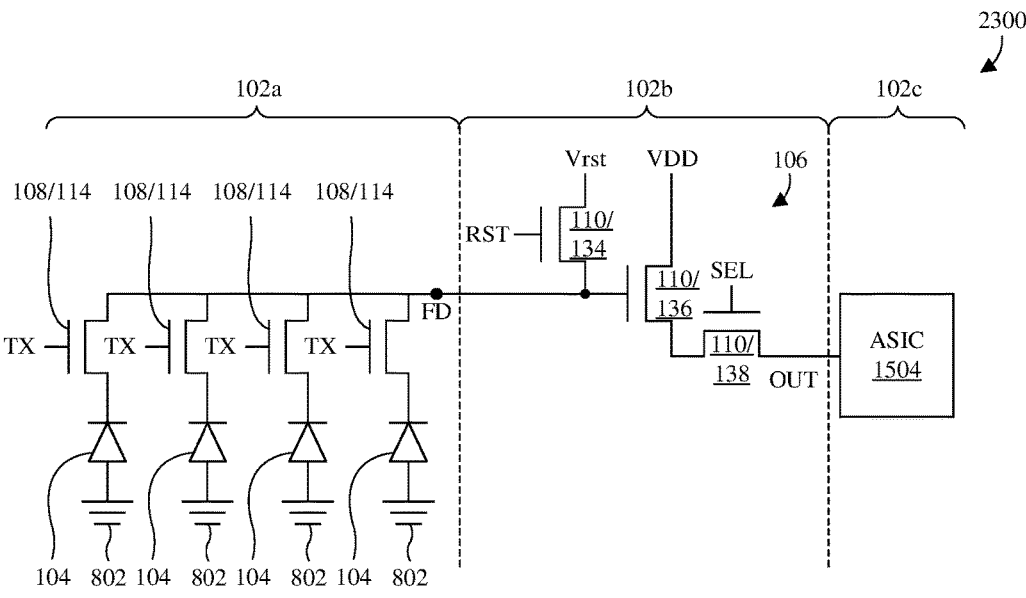
FIG. 23 illustrates a circuit diagram of some embodiments of a pixel sensor of FIG. 22.

With reference to FIG. 23, a circuit diagram 2300 of some embodiments of the image sensor of FIG. 22 is provided. The circuit diagram 2300 is similar to the circuit diagram 1300 of FIG. 13, except for inclusion of the ASIC 1504. Further, as should be appreciated, the circuit diagram 2300 illustrates a single pixel sensor 106.

Figure 24:
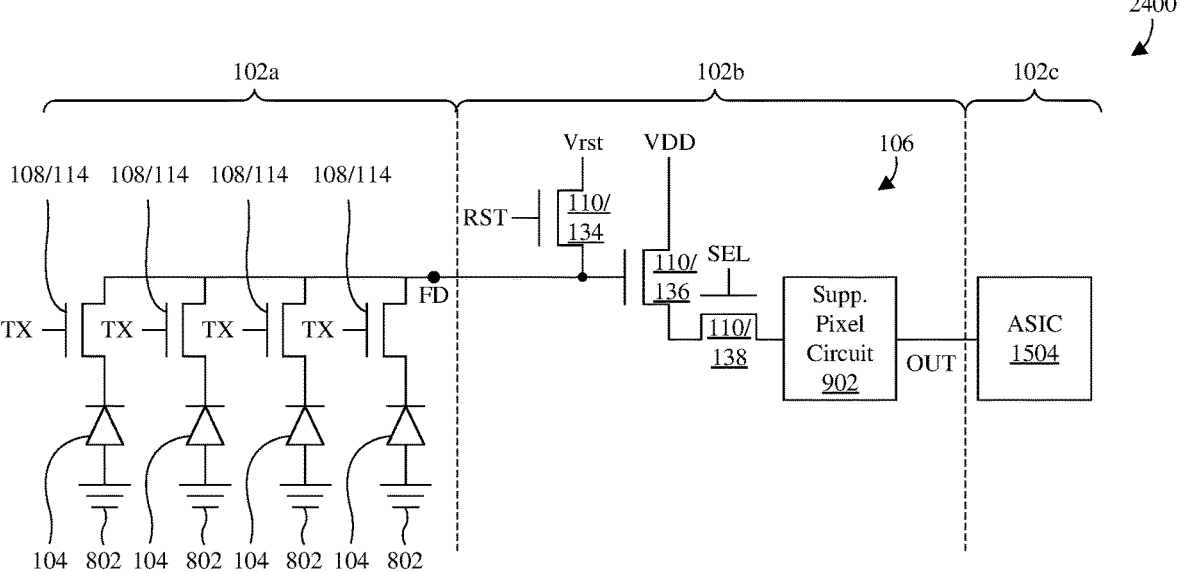
FIG. 24 illustrates a circuit diagram of some alternative embodiments of a pixel sensor of FIG. 22.

With reference to FIG. 24, a circuit diagram 2400 of some alternative embodiments of the image sensor of FIG. 22 is provided. The circuit diagram 2400 is similar to the circuit diagram 2300 of FIG. 23, except for inclusion of a supplemental pixel circuit 902 at the second IC chip 102*b*. The supplemental pixel circuit 902 is electrically coupled between the select transistor 138 and the output terminal OUT of the pixel sensor 106. The supplemental pixel circuit 902 is configured to perform additional processing on a signal from the select transistor 138 before passing it to the output terminal OUT.

With reference to FIGS. 25-37, a series of cross-sectional views 2500-3700 of some embodiments of a method for forming an image sensor is provided in which the image sensor is devoid of STI structures at a first IC chip, which accommodates a photodetector. The method may, for example, be employed to form the image sensor of FIG. 22.

Figure 25:
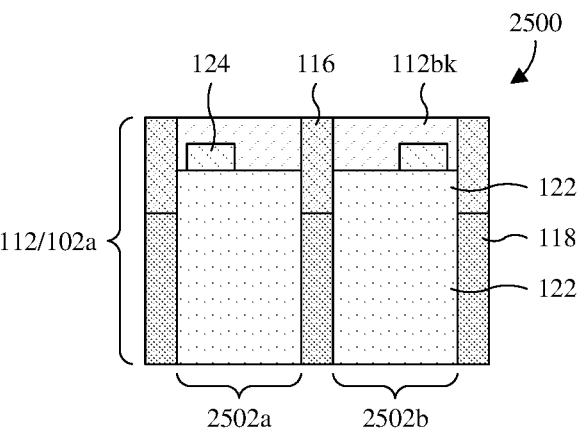
FIGS. 25-37 illustrate a series of cross-sectional views of some embodiments of a method for an image sensor devoid of STI structures at a first IC chip, which accommodates a photodetector of a pixel sensor.
Figure 26:
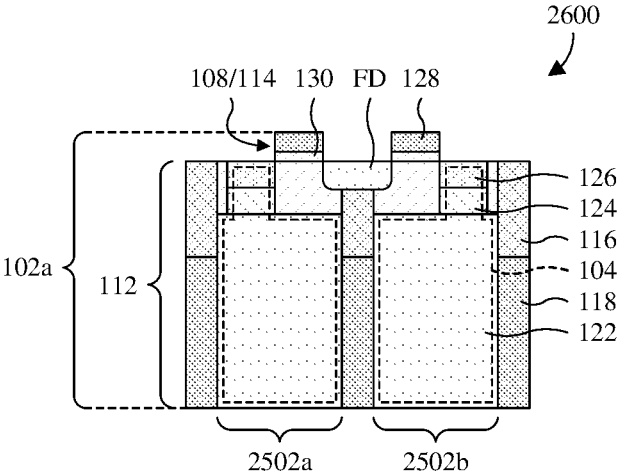
Figure 27:
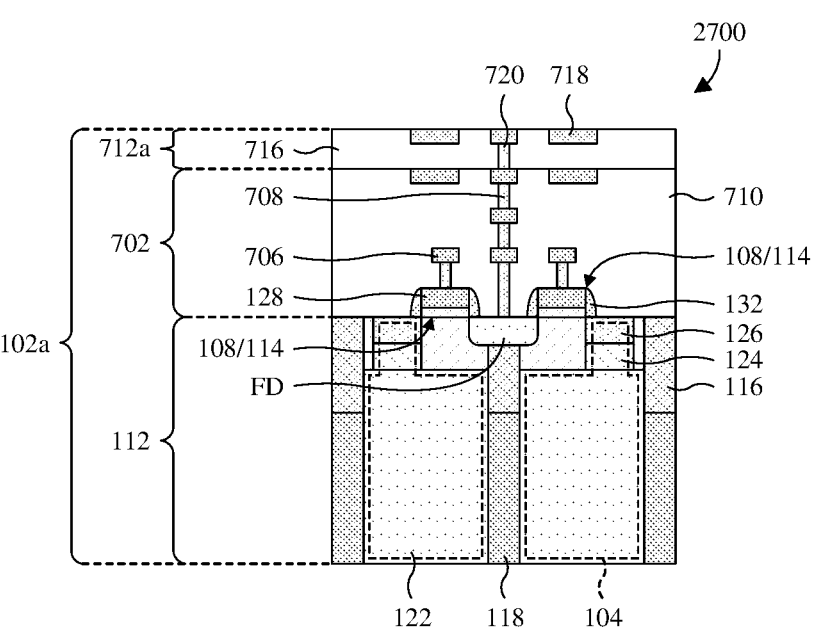

As illustrated by the cross-sectional views 2500-2700 of FIGS. 25-27, a first IC chip 102a is formed. The first IC chip 102a comprises a first portion of a pixel sensor and is devoid of STI structures at the first portion of the pixel sensor. A top layout of the first portion of the pixel senor may, for example, be as shown at FIG. 11 and/or the cross-sectional views 2500-2700 may, for example, be taken along line D-D' in FIG. 11. FIGS. 23 and 24 provide circuit diagrams 2300, 2400 of some embodiments of the first IC chip 102a.

The first portion of the pixel sensor comprises a plurality of photodetectors 104 and a plurality of first transistors 108. The photodetectors 104 correspond to the first transistors 108 with a one-to-one correspondence. Further, each of the first transistors 108 is configured to selectively transfer charge that accumulators at a corresponding one of the photodetectors 104 to a floating diffusion node FD common to the first transistors 108. Hence, the first transistors 108 may also be regarded as transfer transistors 114.

As illustrated more specifically by the cross-sectional view 2500 of FIG. 25, a series of doping processes is performed on a first semiconductor substrate 112. The series of doping processes forms a plurality of first doped regions 122, a plurality of second doped regions 124, a shallow well 116, and a deep well 118. The shallow and deep wells 116, 118 share a first doping type, but have different doping profiles and/or concentrations. Further, the shallow and deep wells 116, 118 demarcate a first photodetector region 2502a and a second photodetector region 2502b in the first semiconductor substrate 112.

The first doped regions 122 are respectively in the first and second photodetector regions 2502a, 2502b. The second doped regions 124 respectively overlie the first doped regions 122 in the first and second photodetector regions 2502a, 2502b. Further, the second doped regions 124 are surrounded by a bulk region 112bk of the first semiconductor substrate 112. The first and second doped regions 122, 124 share a second doping type, but have different doping profiles and/or concentrations. The first and second doping types are opposite to each other. For example, the first doping type may be p type and the second doping type may be n type or vice versa. In some embodiments, the bulk region 112bk has the first doping type. In other embodiments, the bulk region 112bk is intrinsic.

In some embodiments, the series of doping processes comprises: 1) blanket doping the first semiconductor substrate 112 to form a doped layer corresponding to the first doped regions 122; 2) selective doping to form the shallow and deep wells 116, 118 after the doped layer; and 3) selective doping to form the second doped regions 124 after the shallow and deep wells 116, 118. Blanket doping may, for example, be doping without a mask (e.g., without a photolithographic mask or the like), whereas selective doping may, for example, be doping with a mask (e.g., with a photolithographic mask or the like) in place. The doping processes may, for example, be performed by ion implantation or the like.

As illustrated by the cross-sectional view 2600 of FIG. 26, a plurality of first gate electrodes 128 and a plurality of first gate dielectric layers 130 are formed on a frontside of the first semiconductor substrate 112. The first gate dielectric layers 130 are respectively at the first and second photodetector regions 2502a, 2502b, and the first gate electrodes 128 respectively overlie the first gate dielectric layers 130. Formation of the first gate electrodes 128 and the first gate dielectric layers 130 may, for example, comprise depositing a dielectric layer and a conductive layer and subsequently patterning the dielectric and conductive layers respectively into the first gate dielectric layers 130 and the first gate electrodes 128.

Also illustrated by the cross-sectional view 2600 of FIG. 26, a series of doping processes is performed to form a plurality of third doped regions 126 and a floating diffusion node FD in the first semiconductor substrate 112. The floating diffusion node FD overlies the shallow well 116, between the first gate electrodes 128. Further, the floating diffusion node FD has the second doping type, which is opposite to the first doping type shared by the shallow and deep wells 116, 118. In other words, the floating diffusion node FD shares a doping type with the first and second doped regions 122, 124.

The third doped regions 126 respectively overlie the second doped regions 124 in the first and second photodetector regions 2502a, 2502b. Further, the third doped regions 126 have the first doping type, which is opposite to the second doping type shared by the first and second doped regions 122, 124. In other words, the third doped regions 126 share a doping type with the shallow and deep wells 116, 118. Accordingly, the third doped regions 126 have an opposite doping as the floating diffusion node FD.

In some embodiments, the series of doping processes comprises: 1) selective doping to form the third doped regions 126; and 2) selective doping to form the floating diffusion node FD before or after forming the third doped regions 126. Selective doping may, for example, be doping with a mask (e.g., with a photolithographic mask or the like) in place. The doping processes may, for example, be performed by ion implantation or the like.

The third doped regions 126, together with the first and second doped regions 122, 124, form the photodetectors 104 respectively at the first and second photodetector regions 2502a, 2502b. Further, the first gate dielectric layers 130 and the first gate electrodes 128, together with the floating diffusion node FD and the first and second doped regions 122, 124 form the first transistors 108. The floating diffusion node FD forms a source/drain region that is common to the first transistors 108, whereas the first and second doped regions 122, 124 form source/drain regions individual to the first transistors 108.

During use of the photodetectors 104, charge accumulates in the first and second doped regions 122, 124 in response to incident radiation. Hence, the first and second doped regions 122, 124 may be regarded as collector regions. Further, the first transistors 108 selectively transfer the accumulated charge to the floating diffusion node FD. Hence, the first transistors 108 may be regarded as transfer transistors 114.

As illustrated by the cross-sectional view 2700 of FIG. 27, a plurality of first sidewall spacers 132 is formed on sidewalls of the first gate electrodes 128. The first sidewall spacers 132 are dielectric and may, for example, be formed by depositing a dielectric layer on the first gate electrodes 128 and subsequently etching back the dielectric layer. Other suitable processes are, however, amenable.

Also illustrated by the cross-sectional view 2700 of FIG. 27, a first interconnect structure 702 is formed over and electrically coupled to the first transistors 108 and the floating diffusion node FD. The first interconnect structure 702 comprises a plurality of wires 706 and a plurality of vias 708 in an interconnect dielectric layer 710. The wires 706 and the vias 708 are grouped respectively into a plurality of wire levels and a plurality of via levels that are alternatingly stacked to define conductive paths.

Also illustrated by the cross-sectional view 2700 of FIG. 27, a first bond substructure 712a is formed on the first interconnect structure 702. The first bond substructure 712a comprises a plurality of bond pads 718 and a bond via 720 in a bond dielectric layer 716. The bond pad 718 and the bond dielectric layer 716 form a common bond surface, and the bond via 720 extends from a respective bond pad 718 to the first interconnect structure 702.

Figure 28:
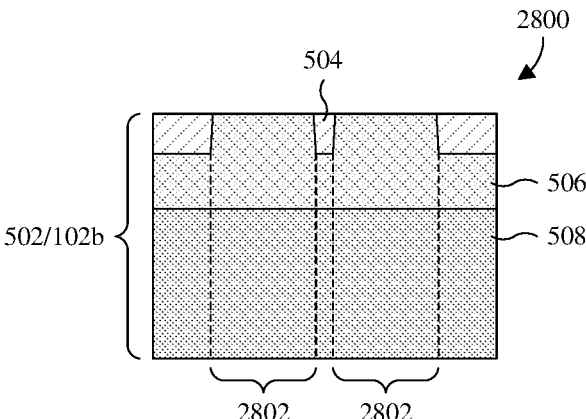
Figure 29:
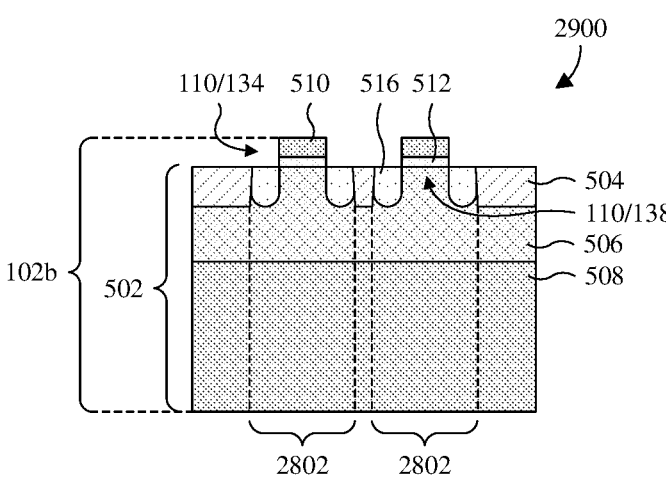
Figure 30:
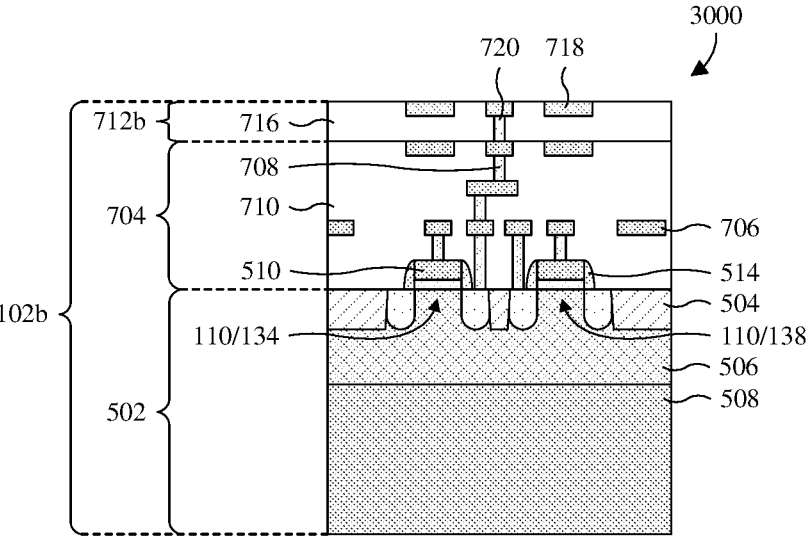

As illustrated by the cross-sectional views 2800-3000 of FIGS. 28-30, a second IC chip 102b is formed. The second IC chip 102b comprises a second portion of the pixel sensor and further comprises STI structures electrically isolating devices of the pixel sensor. A top layout of the second portion of the pixel senor may, for example, be as shown at FIG. 6 and/or the cross-sectional views 2800-3000 may, for example, be taken along line C-C' in FIG. 6. FIGS. 23 and 24 provide circuit diagrams 2300, 2400 of some embodiments of the second IC chip 102b.

As illustrated more specifically by the cross-sectional view 2800 of FIG. 28, a series of doping processes is performed on a second semiconductor substrate 502. The series of doping processes forms a shallow well 506 and a deep well 508 underlying the shallow well 506. The shallow and deep wells 506, 508 share a doping type (e.g., p type or n type), but have different doping profiles and/or concentrations.

In some embodiments, the series of doping processes comprises: 1) blanket doping the second semiconductor substrate 502 to form the deep well 508; and 2) blanket doping the second semiconductor substrate 502 to form the shallow well 506. Blanket doping may, for example, be doping without a mask (e.g., without a photolithographic mask or the like). The doping processes may, for example, be performed by ion implantation or the like.

Also illustrated by the cross-sectional view 2800 of FIG. 28, a STI structure 504 is formed extending into a frontside of the second semiconductor substrate 502 to demarcate device regions 2802 of the second semiconductor substrate 502. As will be seen hereafter, the device regions 2802 correspond transistors of the pixel sensor, which are hereafter formed. The STI structure 504 is or comprises silicon oxide and/or some other suitable dielectric material.

In some embodiments, a process for forming the STI structure 504 comprises: 1) patterning the second semiconductor substrate 502 to form a trench; 2) depositing a dielectric layer in the trench; and 3) performing planarization into the dielectric layer to remove portions of the dielectric layer outside the trench. The patterning may, for example, be performed by a photolithography/etching process or the like.

As illustrated by the cross-sectional view 2900 of FIG. 29, a plurality of second transistors 110, including a reset transistor 134 and a select transistor 138, is formed on the frontside of the second semiconductor substrate 502. The second transistors 110 are formed respectively on the device regions 2802 demarcated by the STI structure 504, and are separated and electrically isolated from each other by the STI structure 504.

The second transistors 110 comprise individual second gate electrodes 510, individual second gate dielectric layers 512, and individual pairs of second source/drain regions 516. The second gate electrodes 510 are stacked respectively with the second gate dielectric layers 512, and the second gate dielectric layers 512 separate the second gate electrodes 510 from the second semiconductor substrate 502. The second source/drain regions 516 are in the second semiconductor substrate 502, and each of the second gate electrodes 510 is between the second source/drain regions of a respective pair of second source/drain regions 516.

Formation of the second gate electrodes 510 and the second gate dielectric layers 512 may, for example, comprise depositing a dielectric layer and a conductive layer and subsequently patterning the dielectric and conductive layers respectively into the second gate dielectric layers 512 and the second gate electrodes 510. Formation of the second source/drain regions 516 may, for example, comprise selective doping of the second semiconductor substrate 502. Selective doping may, for example, be doping with a mask (e.g., with a photolithographic mask or the like) in place. The doping may, for example, be performed by ion implantation or the like.

As illustrated by the cross-sectional view 3000 of FIG. 30, a plurality of second sidewall spacers 514 is formed on sidewalls of the second gate electrodes 510. The second sidewall spacers 514 are dielectric and may, for example, be formed by depositing a dielectric layer on the second gate electrodes 510 and subsequently etching back the dielectric layer. Other suitable processes are, however, amenable.

Also illustrated by the cross-sectional view 3000 of FIG. 30, a second interconnect structure 704 is formed over and electrically coupled to the second transistors 110. Other than a different layout, the second interconnect structure 704 is as the first interconnect structure 702 is described. Hence, the second interconnect structure 704 comprises a plurality of wires 706 and a plurality of vias 708 stacked in an interconnect dielectric layer 710.

Also illustrated by the cross-sectional view 3000 of FIG. 30, a second bond substructure 712b is formed on the second interconnect structure 704. The second bond substructure 712b is as the first bond substructure 712a is described and hence comprises a plurality of bond pads 718 and a bond via 720 in a bond dielectric layer 716.

Figures 31, 32:
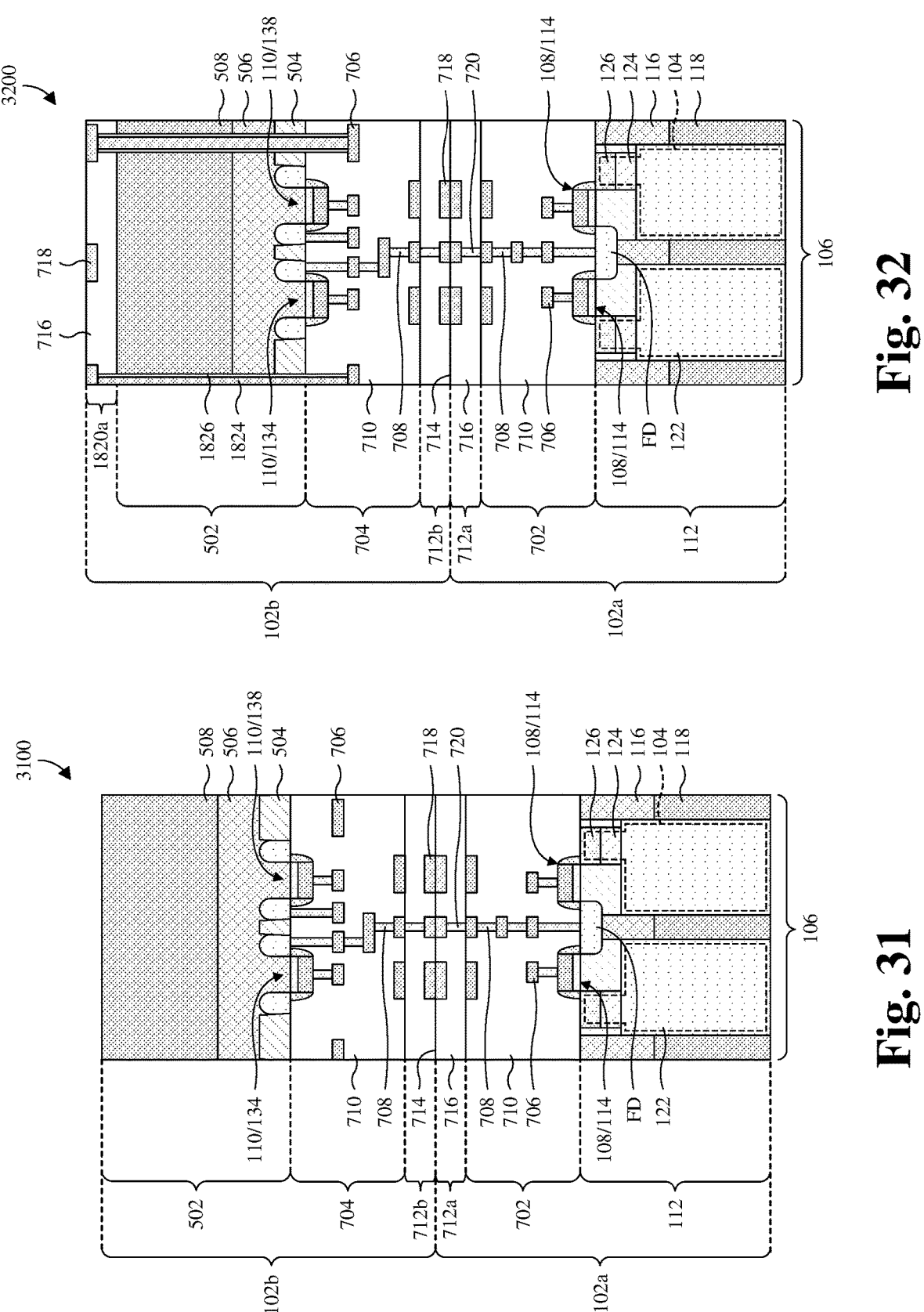

As illustrated by the cross-sectional view 3100 of FIG. 31, the second IC chip 102b of FIG. 30 is vertically flipped and is bonded to the first IC chip 102a of FIG. 27 at a first bond interface 714. The bonding comprises both metal-to-metal bonding and dielectric-to-dielectric bonding at the first bond interface 714. Further, the bonding forms a pixel sensor 106 from the first portion of the pixel sensor at FIG. 27 and the second portion of the pixel sensor at FIG. 30. The pixel sensor 106 may, for example, have a circuit diagram as in FIG. 23 of FIG. 24.

As seen at FIG. 31, the image sensor is devoid of STI structures at the photodetectors 104. It has been appreciated that the shallow and deep wells 116, 118 and a DTI structure hereafter formed is sufficient to provide electrical isolation for the portion of the pixel sensor 106 at the first IC chip 102a without any significant performance tradeoff.

If an STI structure were to extend into the frontside of the first semiconductor substrate 112, substrate etching during formation of the STI structure would cause crystalline damage. This crystalline damage would cause leakage/dark current that reduces image sensor performance. The shallow well 116 could be formed around the STI structure to suppress the leakage/dark current at the STI structure. However, the shallow well 116 would have a larger width to sufficiently suppress the leakage/dark current. This larger width would reduce the size of the photodetectors 104, thereby limiting scaling down.

By omitting STI structure at the photodetectors 104, the shallow well 116 may have a small width and may hence consume less area of the photodetectors 104. This enlarges FWC of the photodetectors 104 and enhances charge transfer from the photodetectors 104, which allow enhanced scaling down of the pixel sensor 106.

Because the photodetectors 104 are relatively large and are at the first IC chip 102*a*, but not at the second IC chip 102*b*, the portion of the pixel sensor 106 at the first IC chip 102*a* may be what limits scaling down of the pixel sensor 106. Hence, scaling down the pixel sensor 106 at the first IC chip 102*a* may have the effect of scaling down an entirety of the pixel sensor 106. Further, the portion of the pixel sensor 106 at the second IC chip 102*b* may have a surplus of space. Because of the surplus of space at the second IC chip 102*b*, STI structures may be used at the second IC chip without limiting scaling down of the pixel sensor 106. Such STI structures provide enhanced electrical isolation at the second IC chip 102*b*.

As illustrated by the cross-sectional view 3200 of FIG. 32, a plurality of TSVs 1824 is formed extending through the second semiconductor substrate 502 to the second interconnect structure 704. Further, the TSVs 1824 are formed separated from the second semiconductor substrate 502 by TSV dielectric layers 1826 individual to the TSVs 1824. The TSVs 1824 are conductive and provide electrical coupling to the second interconnect structure 704 from a backside of the second semiconductor substrate 502.

Also illustrated by the cross-sectional view 3200 of FIG. 32, a third bond substructure 1820*a* is formed on the backside of the second semiconductor substrate 502. The third bond substructure 1820*a* is similar to the first bond substructure 712*a* and hence comprises a plurality of bond pads 718 in a bond dielectric layer 716. However, in contrast with the first bond substructure 712*a*, the third bond substructure 1820*a* lacks bond vias 720. Instead, the TSVs 1824 extend to the bond pads 718 of the third bond substructure 1820*a*.

Figure 33:
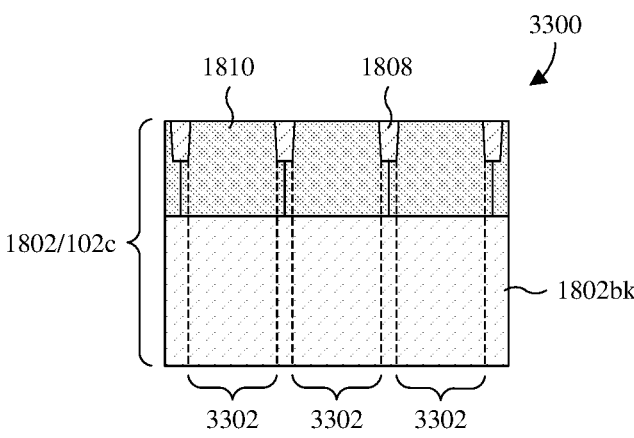
Figure 34:
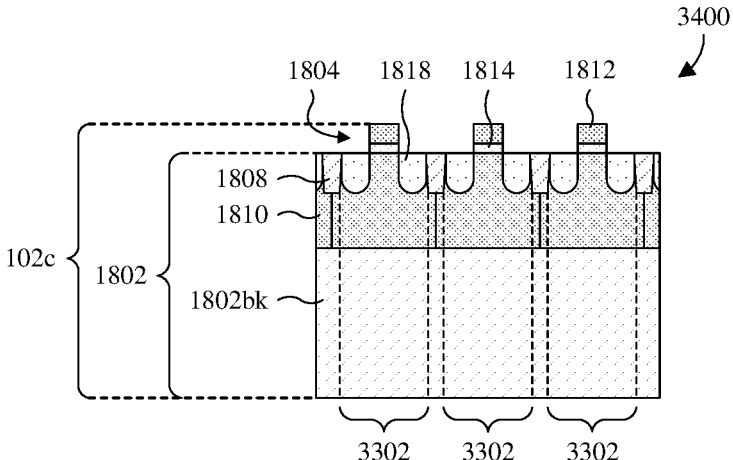
Figure 35:
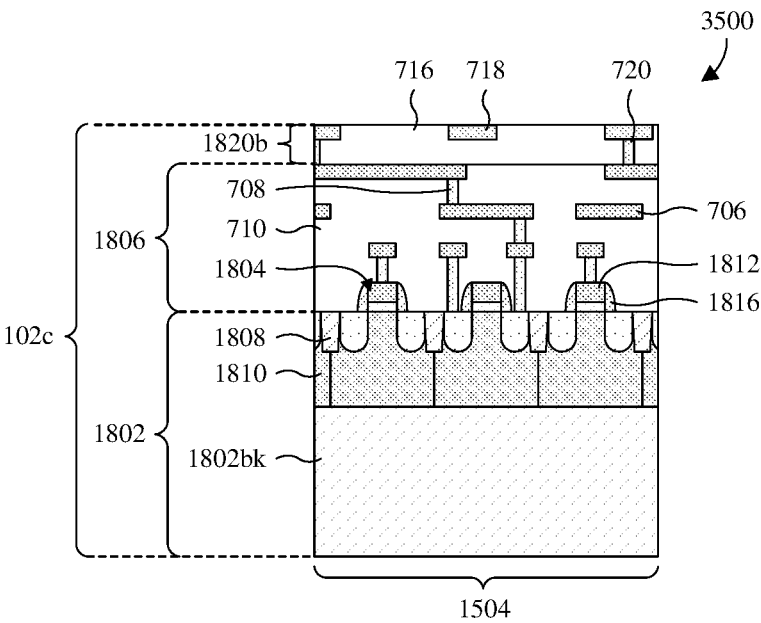

As illustrated by the cross-sectional views 3300-3500 of FIGS. 33-35, a third IC chip 102*c* is formed. The third IC chip 102*c* comprises an ASIC 1504 and further comprises STI structures electrically isolating devices of the ASIC 1504. The ASIC 1504 may, for example, be configured to perform ISP on an output of the pixel sensor 106 and other pixel sensors. A block diagram of the ASIC 1504 may, for example, be as shown at FIG. 15D or at FIG. 16B.

As illustrated more specifically by the cross-sectional view 3300 of FIG. 33, a STI structure 1808 is formed extending into a frontside of a third semiconductor substrate 1802 to demarcate device regions 3302. As will be seen hereafter, the device regions 3302 correspond transistors of the ASIC 1504, which are hereafter formed. The STI structure 1808 is or comprises a silicon oxide and/or some other suitable dielectric material.

In some embodiments, a process for forming the STI structure 1808 comprises: 1) patterning the third semiconductor substrate 1802 to form a trench; 2) depositing a dielectric layer in the trench; and 3) performing planarization into the dielectric layer to remove portions of the dielectric layer outside the trench. The patterning may, for example, be performed by a photolithography/etching process or the like.

Also illustrated by the cross-sectional view 3300 of FIG. 33, a series of doping processes is performed on the third semiconductor substrate 1802. The series of doping processes forms a plurality of doped wells 1810 overlying a bulk region 1802*bk* of the third semiconductor substrate 1802, respectively at the device regions 3302. The doped wells 1810 may, for example, have varying doping types, such as, for example, n type and p type.

In some embodiments, the series of doping processes comprises: 1) selective doping of the third semiconductor substrate 1802 to form doped wells 1810 having a first doping; and 2) selective doping of the third semiconductor substrate 1802 to form doped wells 1810 having a second doping type opposite the first doping type. Selective doping may, for example, be doping with a mask (e.g., with a photolithographic mask or the like) in place. The doping processes may, for example, be performed by ion implantation or the like.

As illustrated by the cross-sectional view 3400 of FIG. 34, a plurality of third transistors 1804 is formed on the frontside of the third semiconductor substrate 1802. The third transistors 1804 are formed respectively on the device regions 3302 demarcated by the STI structure 1808, and are separated and electrically isolated by the STI structure 1808.

The third transistors 1804 comprise individual third gate electrodes 1812, individual third gate dielectric layers 1814, and individual pairs of third source/drain regions 1818. The third gate electrodes 1812 are stacked respectively with the third gate dielectric layers 1814, and the third gate dielectric layers 1814 separate the third gate electrodes 1812 from the third semiconductor substrate 1802. The third source/drain regions 1818 are in the third semiconductor substrate 1802, and each of the third gate electrodes 1812 is between the third source/drain regions of a respective pair of third source/drain regions 1818.

Formation of the third gate electrodes 1812 and the third gate dielectric layers 1814 may, for example, comprise depositing a dielectric layer and a conductive layer and subsequently patterning the dielectric and conductive layers respectively into the third gate dielectric layers 1814 and the third gate electrodes 1812. Formation of the third source/drain regions 1818 may, for example, comprise selective doping of the third semiconductor substrate 1802. Selective doping may, for example, be doping with a mask (e.g., with a photolithographic mask or the like) in place. The doping processes may, for example, be performed by ion implantation or the like.

As illustrated by the cross-sectional view 3500 of FIG. 35, a plurality of third sidewall spacers 1816 are formed on sidewalls of the third gate electrodes 1812. The third sidewall spacers 1816 are dielectric and may, for example, be formed by depositing a dielectric layer on the third gate electrodes 1812 and subsequently etching back the dielectric layer. Other suitable processes are, however, amenable.

Also illustrated by the cross-sectional view 3500 of FIG. 35, a third interconnect structure 1806 is formed over and electrically coupled to the third transistors 1804. Other than a different layout, the third interconnect structure 1806 is as the first interconnect structure 702 is described. Hence, the third interconnect structure 1806 comprises a plurality of wires 706 and a plurality of vias 708 stacked in an interconnect dielectric layer 710.

The third interconnect structure 1806 electrically couples the third transistors 1804 together to form the ASIC 1504. The ASIC is configured for ISP on an output the pixel sensor 106 and any other pixel sensors of the image sensor. The ASIC 1504 may, for example, comprise a row circuit, a column circuit, an ADC, a controller circuit, a DAC, some other suitable circuit, the like, or any combination of the foregoing.

Also illustrated by the cross-sectional view 3500 of FIG. 35, a fourth bond substructure 1820*b* is formed on the third interconnect structure 1806. The fourth bond substructure 1820*b* is as the first bond substructure 712*a* is described and hence comprises a plurality of bond pads 718 and a bond via 720 in a bond dielectric layer 716.

Figure 36:
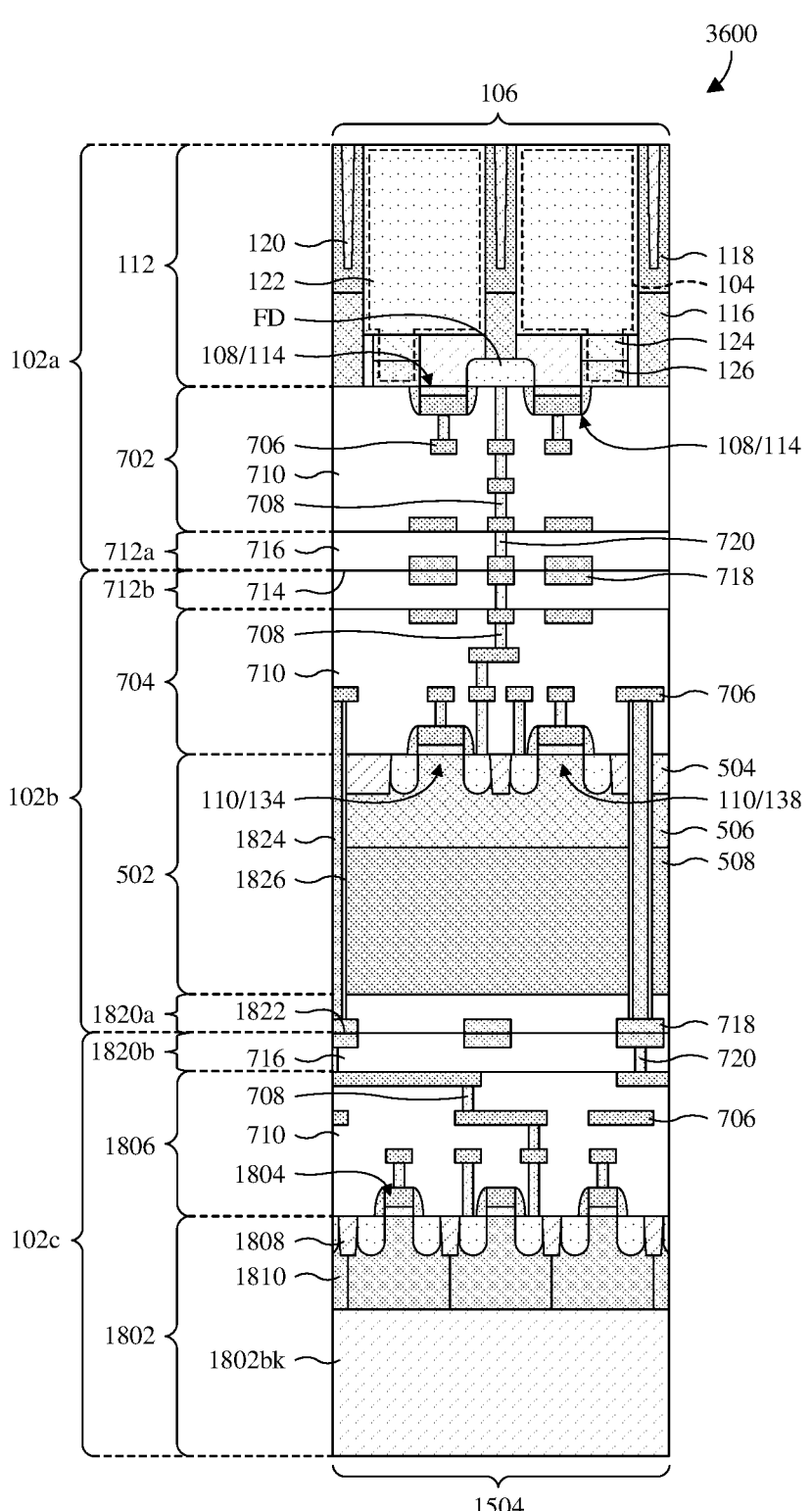

As illustrated by the cross-sectional view 3600 of FIG. 36, the structure of FIG. 32 is vertically flipped and is bonded to the third IC chip 102c of FIG. 35 at a second bond interface 1822. The bonding electrically couples the pixel sensor 106 to the ASIC 1504 and comprises both metal-to-metal bonding and dielectric-to-dielectric bonding.

Also illustrated by the cross-sectional view 3600 of FIG. 36, a DTI structure 120 is formed extending into the backside of the first semiconductor substrate 112. The DTI structure 120 is or comprises a high k dielectric, the like, or any combination of the foregoing. In some embodiments, a process for forming the DTI structure 120 comprises: 1) patterning the third semiconductor substrate 1802 to form a trench; 2) depositing a dielectric layer in the trench; and 3) performing planarization into the dielectric layer to remove portions of the dielectric layer outside the trench. The patterning may, for example, be performed by a photolithography/etching process or the like.

Figure 37:
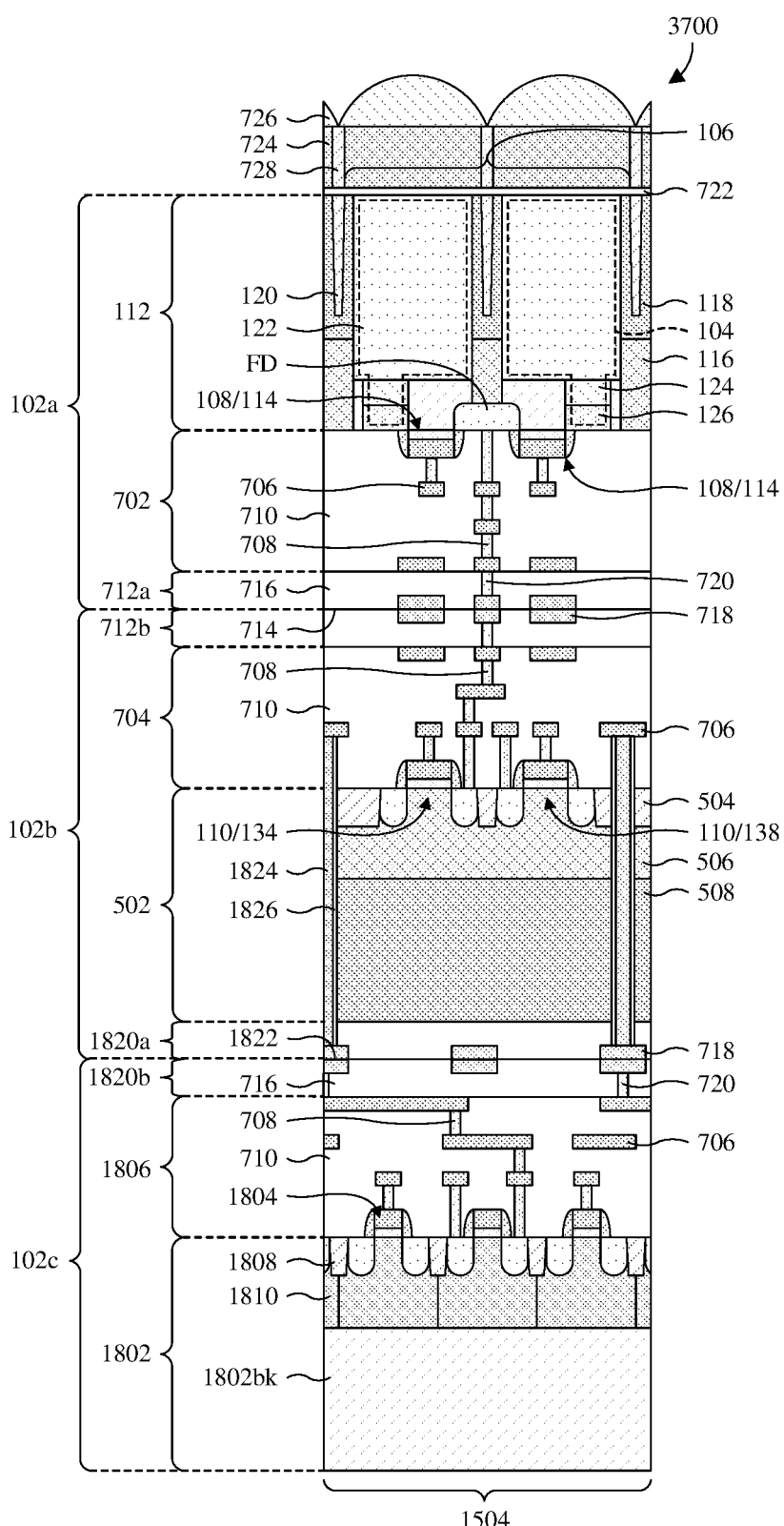

As illustrated by the cross-sectional view 3700 of FIG. 37, a backside passivation layer 722, a plurality of color filters 724, a plurality of micro lenses 726, and a grid structure 728 are formed on a backside of the first semiconductor substrate 112. The backside passivation layer 722 blankets the backside of the first semiconductor substrate 112. The color filters 724 overlie the backside passivation layer 722 and respectively overlie the photodetectors 104. Further, the color filters 724 are separated from each other by the grid structure 728. The micro lenses 726 respectively overlie the color filters 724.

While FIGS. 25-37 are described with reference to a method, it will be appreciated that the structures shown in these figures are not limited to the method but rather may stand alone separate of the method. While FIGS. 25-37 are described as a series of acts, it will be appreciated that the order of the acts may be altered in other embodiments. While FIGS. 25-37 illustrate and describe as a specific set of acts, some acts that are illustrated and/or described may be omitted in other embodiments. Further, acts that are not illustrated and/or described may be included in other embodiments.

With reference to FIG. 38, a block diagram 3800 of some embodiments of the method of FIGS. 25-37 is provided.

At 3802, a first IC chip comprising a first portion of a pixel sensor is formed. The first portion comprises a photodiode and a first transistor adjoining the first transistor. Further, the first IC chip is free of STI structures at the photodiode. Omitting STI structures allows enhanced scaling down of the pixel sensor. See, for example, FIGS. 25-27.

At 3804, a second IC chip comprising a second portion of the pixel sensor is formed. The second portion comprises a plurality of second transistors separated from each other by a STI structure. See, for example, FIGS. 28-30. The pixel sensor may, for example, be a 4T APS or the like.

At 3806, the first and second IC chips are bonded together at a first bond interface. See, for example, FIG. 31.

At 3808, a TSV is formed extending through the second semiconductor substrate to a second interconnect structure of the second IC chip. See, for example, FIG. 32.

At 3810, a bond substructure is formed on and electrically coupled to the TSV. See, for example, FIG. 32.

At 3812, a third IC chip comprising an ASIC for image signal processing (ISP) is formed. The ASIC comprises a plurality of third transistors separated from each other by a STI structure. See, for example, FIGS. 33-35.

At 3814, the second and third IC chips are bonded together at a second bond interface. See, for example, FIG. 36.

At 3816, color filters and micro lenses are formed stacked on the first IC chip. See, for example, FIG. 37.

While the block diagram 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor, including: a first IC chip including a first substrate; a second IC chip stacked with the first IC chip; and a pixel sensor spanning the first and second IC chips, wherein the pixel sensor includes a first transistor and a photodetector in the first IC chip, and further includes a plurality of second transistors in the second IC chip; wherein the photodetector is in the first substrate and the first transistor is on a frontside of the first substrate, and wherein the first IC chip is devoid of a STI structure extending into the frontside at the photodetector. In some embodiments, the first IC chip includes a doped well extending into the first substrate from the frontside and having a grid shaped top geometry surrounding the photodetector, wherein the frontside has a substantially planar profile from a first sidewall of the doped well that faces the photodetector to a second sidewall of the doped well that faces away from the photodetector. In some embodiments, the doped well has an opposite doping type as a source or drain region of the first transistor. In some embodiments, the image sensor further includes a second pixel sensor bordering the pixel sensor and being a repetition of the pixel sensor, wherein the frontside has a substantially planar profile from the pixel sensor to the second pixel sensor. In some embodiments, the second IC chip includes: a second substrate on which the second transistors are arranged; and a STI structure extending into the second substrate and separating the second transistors from each other. In some embodiments, the image sensor further includes: a third IC chip stacked with the first and second IC chips, such that the second IC chip is between the first and third IC chips; and an ASIC for ISP spanning the second and third IC chips. In some embodiments, the pixel sensor has only one transistor in the first IC chip, and has only three or more transistors in the second IC chip. In some embodiments, the plurality of second transistors includes a reset transistor, a source-follower transistor, and a select transistor, wherein the source-follower transistor and the select transistor are electrically coupled in series, and wherein a gate electrode of the source-follower transistor is electrically coupled to a source/drain region of the reset transistor and a source/drain region of the first transistor.

In some embodiments, the present disclosure provides another image sensor, including: a first semiconductor substrate; a first photodetector and a second photodetector bordering in the first semiconductor substrate; a first transistor adjoining the first photodetector on a frontside surface of the first semiconductor substrate, wherein the first transistor has a source or drain region in the first semiconductor substrate; a second semiconductor substrate; and a plurality of second transistors on the second semiconductor substrate; wherein the first photodetector and the first and second transistors form a pixel sensor, and wherein the frontside surface is level with a top of the source or drain region continuously from the first photodetector to the second photodetector. In some embodiments, the image sensor further includes a doped well in the first semiconductor substrate, wherein the doped well separates the first and second photodetectors and has a first sidewall and a second sidewall respectively facing the first and second photodetectors, and wherein the frontside surface is level with the top of the source or drain region continuously from the first sidewall to the second sidewall. In some embodiments, the image sensor further includes a doped well in the first semiconductor substrate, wherein the doped well has an opposite doping type as the source or drain region and further has a columnar profile between the first and second photodetectors, and wherein a top of the columnar profile is substantially flat from the first photodetector to the second photodetector. In some embodiments, the image sensor further includes a second doped well underlying the doped well in the first semiconductor substrate, wherein the second doped well has the opposite doping type and has a columnar profile, which is between the first and second photodetectors and which extends from the doped well to a backside surface of the first semiconductor substrate, opposite the frontside surface, and wherein the columnar profile of the doped well and the columnar profile of the second doped well share a common width. In some embodiments, the image sensor further includes a DTI structure extending into a backside surface of the first semiconductor substrate, opposite the frontside surface of the first semiconductor substrate, and spaced from the frontside surface, wherein the DTI structure has a portion separating the first and second photodetectors, and wherein the first semiconductor substrate is continuous in a vertical direction from the portion to an elevation level with the top of the source or drain region. In some embodiments, the pixel sensor is a 4T APS.

In some embodiments, the present disclosure provides a method for forming an image sensor, including: forming a first integrated circuit (IC) chip, including: forming a photodetector in a first substrate; forming a first transistor on the first substrate, adjacent to the photodetector, wherein the photodetector and the first transistor form a first pixel-sensor portion; forming a second IC chip, including: forming a plurality of second transistors on a second substrate, wherein the second transistors form a second pixel-sensor portion; and bonding the first and second IC chips together such that the first and second pixel-sensor portions are stacked and electrically coupled together to form a pixel sensor; wherein the first transistor is on a semiconductor surface of the first substrate, and wherein the first IC chip is devoid of a STI structure extending into the semiconductor surface at the photodetector. In some embodiments, the forming of the first IC chip includes: doping the first substrate to form a doped well surrounding and demarcating a pixel region at which the photodetector and the first transistor are formed, wherein the semiconductor surface is flat from a first sidewall of the doped well to a second sidewall of the doped well at completion of the first transistor, and wherein the first and second sidewalls respectively face and face away from the photodetector on a common side of the photodetector. In some embodiments, the bonding is performed by bonding in which metal pads respectively of the first and second IC chips are bonded together at an interface and dielectric layers respectively of the first and second IC chips are bonded together at the interface. In some embodiments, the forming of the second IC chip includes: patterning the second substrate to form a trench surrounding and demarcating device regions; and filling the trench with a dielectric material, wherein the second transistors are formed respectively on the device regions, such that the dielectric material separates and electrically isolates the second transistors from each other. In some embodiments, the forming of the first IC chip includes: forming a second photodetector bordering the photodetector in the first substrate, wherein the semiconductor surface extends continuously from the photodetector to the second photodetector at an elevation level with a top of a source or drain region of the first transistor after the forming of the first transistor. In some embodiments, the method further includes: forming a third IC chip, including: forming a plurality of third transistors on a third substrate; and forming an interconnect structure covering the third transistors, wherein the third transistors and the interconnect structure form an ASIC; and bonding the second and third IC chips together, such that the second IC chip is between the first and third IC chips and such that the ASIC is electrically coupled to the pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
 forming a first integrated circuit (IC) chip, comprising:
  forming a pair of photodetectors bordering each other in a first substrate;
  doping the first substrate to form a shallow well and a deep well that share a doping type, wherein the shallow well extends into a first side of the first substrate, the deep well extends into a second side of the first substrate, opposite the first side, to the shallow well, and the shallow and deep wells are between and border the pair of photodetectors; and
  forming a pair of first transistors on the first side of the first substrate, adjacent respectively to the pair of photodetectors, wherein the pair of photodetectors and the pair of first transistors form a first pixel-sensor portion;
 forming a second IC chip, comprising:
  forming a plurality of second transistors on a second substrate, wherein the second transistors form a second pixel-sensor portion; and
 bonding the first and second IC chips together such that the first and second pixel-sensor portions are stacked and electrically coupled together to form a pixel sensor;
 wherein the first IC chip is devoid of a shallow trench isolation (STI) structure extending into the first side of the first substrate at the pair of photodetectors, and wherein the deep well has a width at the second side of the first substrate that corresponds to a separation between the pair of photodetectors.

2. The method according to claim 1, wherein
 the shallow and deep wells surround and demarcate a photodetector region at which a photodetector of the pair of photodetectors and a transistor of the pair of first transistors are formed, wherein the first side of the first substrate is flat from a first sidewall of the first well to a second sidewall of the first well after forming the transistor, and wherein the first and second sidewalls respectively face and face away from the photodetector on a common side of the photodetector.

3. The method according to claim 1, wherein the forming of the second IC chip comprises:

patterning the second substrate to form a trench surrounding and demarcating device regions; and filling the trench with a dielectric material, wherein the second transistors are formed respectively on the device regions, such that the dielectric material separates and electrically isolates the second transistors from each other.

4. The method according to claim 1, wherein a semiconductor surface of the first substrate, which is on the first side of the first substrate, extends continuously from a first photodetector of the pair of photodetectors to a second photodetector of the pair of photodetectors at an elevation level with a top of a source or drain region of a transistor of the pair of first transistors after the forming of the pair of first transistors.

5. The method according to claim 1, further comprising:

forming a third IC chip, comprising:

forming a plurality of third transistors on a third substrate; and forming an interconnect structure covering the third transistors, wherein the third transistors and the interconnect structure form an application-specific integrated circuit (ASIC); and bonding the second and third IC chips together, such that the second IC chip is between the first and third IC chips and such that the ASIC is electrically coupled to the pixel sensor.

6. The method according to claim 1, wherein the pair of first transistors share a common source/drain region formed atop the shallow well and having an opposite doping type as the shallow well.

7. The method according to claim 1, wherein a photodetector of the pair of photodetectors comprises a doped collector region in the first substrate and having another doping type that is opposite the doping type of the shallow and deep wells, and wherein the doped collector region and the deep well have individual boundaries facing away from the first side of the first substrate and level with each other at the second side of the first substrate.

8. The method according to claim 1, wherein the deep well has an additional width that is shared with the shallow well at an interface at which the shallow and deep wells contact each other, and wherein the additional width corresponds to the separation between the pair of photodetectors.

9. A method for forming an image sensor, comprising:

forming a pair of photodetectors bordering in a first semiconductor substrate;

forming a pair of first transistors respectively bordering the pair of photodetectors on a first surface of the first semiconductor substrate, wherein the pair of first transistors share a source or drain region in the first semiconductor substrate and the source or drain region overlies and is spaced from the pair of photodetectors;

forming a plurality of second transistors on a second semiconductor substrate; and bonding the first and second semiconductor substrates together with the pair of first transistors being between the first and second semiconductor substrates;

wherein the pair of photodetectors, the pair of first transistors, and the plurality of second transistors form a pixel sensor, and wherein the first surface of the first semiconductor substrate is level with a top of the source or drain region continuously from a first photodetector of the pair of photodetectors to a second photodetector of the pair of photodetectors.

10. The method according to claim 9, wherein the pixel sensor has only one transistor per photodetector on the first semiconductor substrate.

11. The method according to claim 9, wherein the pair of photodetectors comprise individual doped collector regions, which have a first doping type and which are formed in the first semiconductor substrate while forming the pair of photodetectors, and wherein the source or drain region is formed overlying and spaced from the individual doped collector regions and with the first doping type.

12. The method according to claim 11, further comprising:

forming a shallow well in the first semiconductor substrate, extending from the first surface of the first semiconductor substrate to a first depth; and forming a deep well in the first semiconductor substrate, extending from the shallow well at the first depth to a second surface of the first semiconductor substrate opposite the first surface, wherein the shallow well and the deep well laterally contact the individual doped collector regions of the pair of photodetectors and share a second doping type opposite the first doping type, and wherein the shallow well contacts the source or drain region.

13. The method according to claim 12, further comprising:

after the bonding, forming a deep trench isolation structure extending into the deep well from the second surface of the first semiconductor substrate, wherein the deep trench isolation structure is spaced from the shallow well.

14. The method according to claim 12, wherein the shallow well and the deep well form an isolation region having a columnar profile between the pair of photodetectors and having a width that is substantially uniform from the source or drain region to the second surface of the first semiconductor substrate.

15. A method for forming an image sensor, comprising:

forming a first photodetector and a second photodetector bordering in a first semiconductor substrate;

forming a shallow well and a deep well between and bordering the first and second photodetectors, wherein the shallow well and the deep well are stacked with a common doping type and extend from a first side of the first semiconductor substrate to a second side of the first semiconductor substrate opposite the first side;

forming a pair of first transistors respectively bordering the first and second photodetectors on the first side of the first semiconductor substrate, wherein the pair of first transistors share a common source/drain region on the shallow well;

forming first bond pads overlying and electrically coupled to a first pixel-sensor portion formed by the first and second photodetectors and the pair of first transistors;

forming a plurality of second transistors on a second semiconductor substrate;

forming second bond pads overlying and electrically coupled to a second pixel-sensor portion formed by the plurality of second transistors; and bonding the second semiconductor substrate to the first semiconductor substrate via the first and second bond pads;

wherein the bonding electrically couples the first and second pixel-sensor portions together to form a pixel sensor, and wherein the shallow well and the deep well share a common width at a periphery of the pixel sensor, and wherein the common source/drain region is spaced from the first and second photodetectors and fully separates the shallow well from the first side of the first semiconductor substrate in a cross-sectional plane.

16. The method according to claim 15, wherein the shallow well, the deep well, and the common source/drain region have individual heights that sum to a height of the first semiconductor substrate.

17. The method according to claim 15, wherein the common source/drain region has a width greater than the common width.

18. The method according to claim 15, further comprising:

forming a first interconnect structure overlying and electrically coupled to the pair of first transistors;

forming a first bond structure overlying and electrically coupled to the first interconnect structure and comprising the first bond pads;

forming a second interconnect structure overlying and electrically coupled to the plurality of second transistors; and forming a second bond structure overlying and electrically coupled to the second interconnect structure and comprising the second bond pads, wherein the first bond structure and the second bond structure contact during the bonding.

19. The method according to claim 15, wherein the first photodetector comprises a doped collector region in the first semiconductor substrate and having a doping type opposite the common doping type, and wherein the doped collector region extends to the second side of the first semiconductor substrate and is spaced from the first side of the first semiconductor substrate.

20. The method according to claim 19, wherein the first photodetector further comprises an additional doped collector region extending from the doped collector region towards the first side of the first semiconductor substrate, wherein the additional doped collector region has the doping type of the doped collector region and is spaced from the deep well, the shallow well, and the first side of the first semiconductor substrate, and wherein the doped collector region laterally contacts the shallow and deep wells.

* * * * *